United States Patent

Mori et al.

[11] Patent Number: 5,780,853
[45] Date of Patent: Jul. 14, 1998

[54] SCANNING ELECTRON MICROSCOPE

[75] Inventors: Futoshi Mori, Kanagawa-ken; Kazuhiko Fukazawa, Tokyo; Hiroshi Hirose; Yoshiaki Kohama, both of Kanagawa-ken, all of Japan

[73] Assignee: Nikon Corporation, Tokyo, Japan

[21] Appl. No.: 749,214

[22] Filed: Nov. 14, 1996

Related U.S. Application Data

[62] Division of Ser. No. 540,032, Oct. 6, 1995, Pat. No. 5,646,403.

[30] Foreign Application Priority Data

| Oct. 28, 1994 | [JP] | Japan | 6-264792 |
| Oct. 28, 1994 | [JP] | Japan | 6-264793 |
| Dec. 21, 1994 | [JP] | Japan | 6-318250 |
| Dec. 21, 1994 | [JP] | Japan | 6-318251 |

[51] Int. Cl.[6] .......................... H01J 37/20
[52] U.S. Cl. ............. 250/310; 250/442.11; 250/398
[58] Field of Search ......................... 250/310, 306, 250/398, 492.2, 442.11

[56] References Cited

U.S. PATENT DOCUMENTS

| 3,816,651 | 6/1974 | Gardner | 178/7.2 |
| 4,687,931 | 8/1987 | Fukuhara et al. | 250/398 |
| 5,610,406 | 3/1997 | Kai et al. | 250/492.22 |

*Primary Examiner*—Bruce Anderson
*Attorney, Agent, or Firm*—Armstrong, Westerman, Hattori, McLeland & Naughton

[57] ABSTRACT

A stage on which a sample is placed is driven through feed screws rotated by pulse motors which are controlled by a micro-step drive control method. Backlash quantities and feed screw pitch errors have previously been obtained and stored in a memory, and when the stage is to be driven, a stage controller corrects the backlash and pitch errors.

7 Claims, 17 Drawing Sheets

SCANNING ELECTRON MICROSCOPE

This is a Divisional application of Ser. No. 08/540,032 filed Oct. 6, 1995 now U.S. Pat. 5,646,403.

BACKGROUND OF THE INVENTION

1. Field of the Invention

The present invention relates to a scanning electron microscope used to observe fine structures such as those of semiconductor devices. More particularly, the present invention relates to a scanning electron microscope having a structure which makes it convenient for an operator to control an observation field which is set on a sample.

2. Description of the Related Art

In a conventional scanning electron microscope, an electron beam is emitted from an electron gun, converged by a converging lens and deflected by deflection coils. The deflected electron beam is passed through an objective lens to scan the surface of a sample in a two-dimensional manner.

Then, secondary electrons emitted from the sample surface are converted into an image signal through a secondary electron detector or other similar detector, and a magnified image of the sample is displayed on the screen of an image display device (e.g., a CRT display) on the basis of the image signal.

The observation magnification can be set to a desired value within a predetermined range by the operator, and the electron beam scanning range, scanning speed, etc. on the sample are adjusted in accordance with the set observation magnification. A range that is specified as an observation object by the operator within the electron beam scanning range on the sample is an "observation field", and an image of the sample in the observation field which is magnified at the set observation magnification is displayed on the screen of the image display device.

There are two methods for moving the observation field on the sample to thereby move the observation image of the sample on the screen of the image display device: a mechanical field moving method in which a stage on which a sample is placed is moved by a movement controller; and an electric field moving method in which the electron beam scanning range on the sample is moved by an electro-optical system control circuit, or an image data selecting region in the scanning range is moved, thereby moving the observation field.

The electric field moving method has the advantage that the image can be moved at a constant speed when the observation magnification is high. On the other hand, the electric field moving method suffers from the disadvantage that the oscillation width of the electron beam is limited to a value which is much smaller than the amount of movement of the stage. The mechanical field moving method, in which the stage is mechanically moved, has the advantage that the observation field can be continuously moved, for example, to a region on the sample which is away from a region which is presently scanned with the electron beam. Therefore, the operator generally uses both the mechanical field moving method and the electric field moving method by changing from one to the other according to need. A device which enables the two methods to be automatically changed according to the observation magnification has also heretofore been used. In this regard, as a conventional stage driving system for mechanically moving the observation field, a feed screw system has heretofore been used in which the stage is fed by driving a feed screw with a pulse motor (i.e. stepping motor) which is driven by a full-step drive control method (or by a half-step drive control method).

As a mechanical field moving method, a position control method has heretofore mainly been used in which a distance by which the observation field is to be moved (hereinafter referred to as "moving distance of the observation field") is calculated according to the amount of rotation of a track ball, and the observation field is moved on the sample by the calculated moving distance in a direction corresponding to the direction of rotation of the track ball. The track ball is a tool in which a rotating member that is buried in an operator console is rotated two-dimensionally, thereby causing pulse signals to be generated from two rotary encoders.

Another device that is used in the mechanical field moving method is a joy stick. The joy stick is a tool in which a shaft for control is rotated two-dimensionally to change output values of two potentiometers, thereby setting a direction of movement and a speed of movement in a two-dimensional plane.

The above-described conventional techniques suffer, however, from the following problems: Since there is backlash in a feed screw that is driven to move the stage, when the moving direction of the stage is reversed, such a phenomenon is likely to occur that, although the pulse motor rotates, the stage will not move for a short while, or that the stage slightly moves in a direction reverse to the direction in which it should move.

The above-described undesired phenomenon is particularly remarkable when the operator moves the stage by open-loop control while viewing the sample observation image displayed on the image display device. Thus, a sense of incongruity is caused, and it is difficult for an operator to control the stage accurately.

Further, to rotate the observation field on the sample, the conventional practice is to tilt the electron beam scanning direction. However, if the stage is moved in order to observe a region which is adjacent to the observation field in a state where the image displayed on the image display device has been rotated, since the moving direction of the stage is determined on the basis of a coordinate system used before the rotation of the observation field, the sample observation image moves in a diagonal direction and is therefore difficult to observe. For example, if the observation field is controlled so as to move toward the right or left side, with the observation field rotated clockwise through 45° from the X-axis, since the stage moves in the direction X, the sample observation image displayed on the image display device moves in a direction which is counterclockwise tilted at 45° with respect to the X-axis.

The conventional scanning electron microscope further involves the problem that, when the operator moves the observation field by the mechanical field moving method, that is, by mechanically driving the stage, while viewing the sample observation image displayed on the image display device, since the sample observation image moving speed varies with the observation magnification, a sense of incongruity results when moving the sample observation image, and it is difficult to place the observation field in a desired position. Particularly, when the observation magnification is high, the sample observation image moves at high speed, and therefore, it is extremely difficult to place the observation field in a desired position.

Further, the conventional scanning electron microscope suffers from the problem that, since a feed screw (e.g. ball screw), which is driven to move the stage, involves a pitch error, it is difficult to put the observation field in a desired position accurately by open-loop control. That is, even if the pitch error of the feed screw falls within the manufacturers' specifications, the positioning accuracy required for the stage may be more stringent than the specifications. In such a case, the above-described problem arises. Particularly, when the observation magnification is high, the effective observation field range, which corresponds to the effective display area of the image display device, becomes extremely narrow, and the positioning accuracy required for the stage becomes extremely high. Thus, the feed screw pitch error must be taken into account.

In view of the above-described circumstances, a first object of the present invention is to provide a scanning electron microscope which enables an observation field on a sample to be moved to a desired position by a mechanical field moving method even if there is backlash in a stage for positioning the sample.

A second object of the present invention is to provide a scanning electron microscope in which, when an observation field on a sample is to be moved toward a neighboring region by a mechanical field moving method in a state where the observation field has been electrically rotated, it is possible to move the observation field independently of the angle of rotation of it while viewing a sample observation image displayed on an image display device, and in which positioning of the observation field is easy.

A third object of the present invention is to provide a scanning electron microscope in which, when an observation field on a sample is to be moved by a mechanical field moving method on the basis of a sample observation image displayed on an image display device, the sample observation image can be moved at a constant speed on the image display device independently of the sample observation magnification no matter how high it is.

A fourth object of the present invention is to provide a scanning electron microscope in which, even if there is a pitch error in a feed screw of a stage for positioning a sample, an observation field on the sample can be accurately moved to a desired position by a mechanical field moving method.

Meanwhile, if a method in which the sample is manually moved through the stage is used, the observation field can be readily moved in a wider range than in the case of a method in which the observation field is electrically changed over. However, the manual stage moving method suffers from the problem that a great deal of time is required to search for a desired image because the image continuously moves. Further, when it is desired to display an image which is adjacent to the presently displayed image on the screen, for example, it is difficult to make the stage come to rest accurately at a point of time when the neighboring image is displayed on the screen. Therefore, the operator is likely to pass the desired image or lose sight of it.

Particularly, when the observation magnification of the scanning electron microscope is high, since the image moves at high speed in response to the drive of the stage, it is extremely difficult to allow the observation field to come to rest at the desired position.

In view of the above-described circumstances, a fifth object of the present invention is to provide a scanning electron microscope in which, when the observation field is to be moved by moving the sample, the observation field can be moved to a region on the sample which is adjacent to the present observation field at high speed and with high accuracy even if the observation magnification is high.

Regarding the above-described conventional techniques, when a sample as an object of observation is a regularly arranged device such as a semiconductor memory, it is sometimes desired to fix the moving direction of the observation field on the sample in a predetermined direction. However, when a joy stick or a track ball is used to input an observation field moving direction, since it is difficult to accurately rotate the control shaft or the rotating member only in a predetermined direction, it is difficult to move the observation field only in a predetermined direction by manual operation.

When the moving distance of the observation field is short, the amount of rotation required for the rotating member of the track ball is relatively small. Therefore, controllability is good. However, when a position on the sample which it is desired to observe is distant from the present observation field, and hence the moving distance of the observation field is long, the amount of rotation of the track ball must be increased, causing controllability to be degraded.

Particularly, in the case of the track ball, the rotational angle of the rotating member is not limited, unlike the joy stick, and the rotating member is isotropic. Therefore, it is extremely difficult to accurately rotate the rotating member only in a predetermined direction.

In view of the above-described circumstances, a further object of the present invention is to provide a scanning electron microscope in which an observation field on a sample can be accurately moved in a predetermined direction even when an input device such as a track ball is used (a sixth object of the present invention), and in which the observation field on the sample can be readily moved to either a near position or a distant position (a seventh object of the present invention).

SUMMARY OF THE INVENTION

First to fourth scanning electron microscopes of the present invention for attaining the above-described first to fourth objects are common to each other in that a surface of a sample is scanned with an electron beam, and an image in a predetermined observation field on the sample is displayed on an image display device by using an image signal obtained by detecting secondary electrons emitted from the sample, and in that the scanning electron microscopes have a feed screw-driven stage for two-dimensionally moving the sample on the electron beam scanning plane, two pulse motors for rotationally driving two feed screws, respectively, of the stage, and a micro-step drive controller for driving the two pulse motors by a micro-step drive control method.

The first scanning electron microscope for attaining the first object of the present invention has a backlash memory for storing an amount of backlash observed when the moving direction of the stage is reversed, and a field movement control unit which, when the observation field is to be moved by a predetermined amount on the sample, corrects the predetermined amount of movement on the basis of the stage moving direction immediately before the present time, a st age moving direction to be taken subsequently, and the storage contents of the backlash memory, and which drives the pulse motors through an angle corresponding to the corrected amount of movement through the micro-step drive controller.

The second scanning electron microscope for attaining the second object of the present invention has an image rotating unit for rotating an image displayed on the image display device through a predetermined angle, and a field movement control unit which drives the pulse motors through the micro-step drive controller so that, when the observation field is to be moved on the sample, the stage advances in a direction defined by the angle through which the displayed image has been rotated.

The third scanning electron microscope for attaining the third object of the present invention has a magnification changing unit for changing the observation magnification of the image displayed on the image display device, and a field movement control unit which, when the observation field is to be moved on the sample, drives the pulse motors through the micro-step drive controller so that the stage advances at a speed obtained by multiplying the moving speed before the observation magnification change made through the magnification changing unit by the ratio of the observation magnification before the magnification change to the observation magnification after the magnification change.

The fourth scanning electron microscope for attaining the fourth object of the present invention has a pitch error memory for storing pitch errors of the two feed screws of the stage, and a field movement control unit which, when the observation field is to be moved by a predetermined amount on the sample, corrects the predetermined amount of movement on the basis of the pitch errors stored in the pitch error memory, and which drives the pulse motors through an angle corresponding to the corrected amount of movement through the micro-step drive controller.

In addition, the present invention provides a fifth scanning electron microscope for attaining the above-described fifth object. The fifth scanning electron microscope has: an electron beam scanning device for scanning a surface of a sample with a converged electron beam; a secondary electron detector for detecting secondary electrons emitted from the sample and for converting them into an image signal; a magnification and field setting unit for setting a sample observation magnification, and an observation field on the sample; an observation control unit for controlling the condition of electron beam scanning conducted by the electron beam scanning device on the basis of the observation magnification and observation field set through the magnification and field setting unit, and for selecting an image signal corresponding to the observation field from the image signal; and an image display device for displaying an image in the observation field on the sample by using the image signal selected through the observation control unit. The fifth scanning electron microscope further has: a sample positioning device for two-dimensionally moving the sample on the electron beam scanning plane; a field moving direction designating unit for setting a direction of movement of the observation field; and a field movement control unit for moving the sample positioning device by a distance equal to the width of the observation field in a moving direction set through the field moving direction designating unit.

In this case, one example of the sample positioning device has a stage capable of two-dimensionally moving with the sample placed thereon, two feed screws connected to the stage, pulse motors for rotationally driving the two feed screws, respectively, and a micro-step drive controller for driving the two pulse motors by a micro-step drive control method.

One example of the observation field that is set through the magnification and field setting unit is a region variable in shape, which is selected as desired from the area on the sample within which the sample surface is scanned with the electron beam.

In addition, the present invention provides a sixth scanning electron microscope for attaining the above-described sixth object, in which a surface of a sample is scanned with an electron beam, and an image in a predetermined observation field on the sample is displayed on an image display device by using an image signal obtained by detecting secondary electrons emitted from the sample. The sixth scanning electron microscope has: a sample stage for two-dimensionally moving the sample on the electron beam scanning plane; a moving direction input device for setting a two-dimensional moving direction of the sample stage through encoders for two axes each of which converts an amount of displacement into an electric signal; a moving direction limiting unit for setting the sample stage moving direction to any of three directions, that is, a predetermined first direction (direction X), a second direction (direction Y) intersecting the first direction, and a two-dimensional direction; and a stage controller for driving the sample stage in a component direction selected through the moving direction limiting unit with respect to a moving direction set through the moving direction input device.

In this case, it is desired for the moving direction input device to set a two-dimensional moving speed of the stage in the first and second directions, and the stage controller preferably drives the sample stage with a speed component in a direction selected through the moving direction limiting unit of a moving speed set through the moving direction input device.

One example of the moving direction input device is a track ball having a rotating member, and two rotary encoders for converting the rotational angles of different surfaces of the rotating member into electric signals.

In addition, the present invention provides a seventh scanning electron microscope for attaining the above-described seventh object, in which a surface of a sample is scanned with an electron beam, and an image in a predetermined observation field on the sample is displayed on an image display device by using an image signal obtained by detecting secondary electrons emitted from the sample. The seventh scanning electron microscope has: a sample stage for two-dimensionally moving the sample on the electron beam scanning plane; a displacement information setting device for setting information concerning displacement of the sample stage in first and second directions intersecting each other through encoders for two axes each of which converts an amount of displacement into an electric signal; a moving mode setting unit for setting a moving mode of the sample stage to either a position control mode or a speed control mode; and a stage controller for controlling the sample stage such that, when the position control mode is set through the moving mode setting unit, the stage controller moves the sample stage to a position corresponding to the amount of change of displacement information set through the displacement information setting device, whereas, when the speed control mode is set through the moving mode setting unit, the stage controller moves the sample stage at a speed corresponding to the amount of change of displacement information set through the displacement information setting device.

In this case, one example of the displacement information setting device is a track ball having a rotating member, and two rotary encoders for converting the rotational angles of different surfaces of the rotating member into electric signals.

According to the first to fourth scanning electron microscopes of the present invention, the stage for positioning the sample is driven through the feed screws by the pulse motors driven by a micro-step drive control method. In the microstep drive control, the smallest step angle of the pulse motor can be reduced to about 1/100 of that in the case of the full-step or half-step drive control. Accordingly, the positioning resolution can be made more than one order in magnitude smaller than the width of the observation field usually set in scanning electron microscopes.

In the first scanning electron microscope, an amount of backlash in the feed screws of the stage is previously obtained and stored in the backlash memory, and when the stage moving direction is reversed during the drive of the stage, the amount by which the stage is to be moved is corrected on the basis of the amount of backlash stored in the memory. At this time, since the stage positioning resolution can be raised to a high level by virtue of the micro-step drive control, the amount of movement of the stage can be accurately corrected even if the amount of backlash is of the order, for example, of 1 µm.

According to the second scanning electron microscope, when the observation field is electrically rotated on the sample through an angle θ with respect to the X-axis, a magnified image of the rotated observation field is displayed on the screen of the image display device. Thereafter, if the operator issues an instruction to move the image toward the right side, the stage moves in a direction tilted at the angle θ with respect to the X-axis; Consequently, the observation field gradually moves from one region to another. At this time, since the positioning resolution of the stage as moved by the micro-step drive control method can be made more than one order in magnitude finer than the width of the observation field usually set in scanning electron microscopes, the observation field can be accurately and smoothly moved.

According to the third scanning electron microscope, even when the observation magnification is changed, the moving speed of the sample observation image on the screen of the image display device is kept constant. Accordingly, the controllability improves. Since the stage can be moved with high resolution by the micro-step drive control, the observation image moving speed can also be controlled with high accuracy.

According to the fourth scanning electron microscope, pitch errors of the feed screws of the stage are previously obtained and stored in the pitch error memory, and the amount by which the stage is to be moved is corrected on the basis of the pitch errors stored in the memory when the stage is to be driven. At this time, since the stage positioning resolution can be raised to a high level by virtue of the micro-step drive control, the amount of movement of the stage can be accurately corrected even if the pitch errors are of the order, for example, of 1 µm.

According to the fifth scanning electron microscope of the present invention, when a direction in which the observation field is to be moved is designated through the field moving direction designating unit, the field movement control unit obtains an actual width of the observation field on the sample on the basis of the observation magnification and the observation field on the sample, which have been set through the magnification and field setting unit. Assuming that the observation field is a rectangle with a width DX in the direction X and with a width DY in the direction Y, and that the observation field is to be moved to a region which is adjacent to the present position in the direction +X, the field movement control unit moves the sample by a width DX in the direction -X by operating the sample positioning device. Consequently, the desired region moves into the observation field.

When the observation field is to be moved to a region which is adjacent to the present position in an oblique direction, the sample is obliquely moved, for example, by a width DX in the direction +X and by a width DY in the direction +Y. Consequently, the region obliquely moves into the observation field. Accordingly, the observation field can be moved to the adjacent region at high speed and with high accuracy independently of the observation magnification.

In a case where the sample positioning device is a feed screw-operated stage which is moved by pulse motors driven by a micro-step drive control method, the pulse motors can be rotated and stopped with extremely fine angular resolution by the micro-step drive control. Accordingly, the stage feed resolution can be made considerably smaller than the width of the observation field of the scanning electron microscope, which is very small. Therefore, the observation field can be accurately moved to a neighboring region.

When the observation field is a region variable in shape, which is selected from the area on the sample within which the sample surface is scanned with the electron beam, the shape and size of the observation field can be electrically adjusted.

According to the sixth scanning electron microscope of the present invention, when the observation field on the sample is desired to move in the first direction (direction X), for example, the moving direction is limited to the first direction through the moving direction limiting unit. Thereafter, even if a direction slightly deviating from the first direction, for example, is set when a moving direction is to be set through the moving direction input device, the observation field moves in the first direction.

In a case where the moving direction input device also sets a moving speed, when the moving direction is limited to the first direction through the moving direction limiting unit, the observation field on the sample moves in the first direction at a speed component in the first direction of the moving speed set through the moving direction input device.

According to the seventh scanning electron microscope of the present invention, when the observation field is desired to move to a near position on the sample, for example, the position control mode is set through the moving mode setting unit. Thereafter, when displacement information is generated from a displacement information setting device having a track ball, for example, the sample stage moves to a position corresponding to the amount of change of the displacement information, causing the observation field to move as desired. Next, when the observation field is desired to move to a faraway position on the sample, the speed control mode is set through the moving mode setting unit. Thereafter, when displacement information is generated from the displacement information setting device, the sample stage moves at a speed corresponding to the amount of change of the displacement information, causing the observation field to move toward the desired position.

When the observation field reaches the vicinity of the desired position, the displacement information generated from the displacement information setting device is returned to the previous state. Consequently, the sample stage stops. Alternatively, the moving mode may be changed to the position control mode when the observation field approaches the vicinity of the desired position. By such an operation, the observation field can be readily moved to various positions as desired without increasing the amount of control operation required at the displacement information setting device.

According to another scanning electron microscope of the present invention in which a surface of a sample is scanned with an electron beam, and an image in a predetermined observation field on the sample is displayed on an image display device by using an image signal obtained by detecting secondary electrons emitted from the sample, the scanning electron microscope comprises a positioning device for two-dimensionally moving the sample on a plene which is scanned with the electron beam; and a drive device for moving the sample by a distance substantially equal to a width of the observation field in a moving direction of the observation field by driving the positioning device.

According to the other scanning electron microscope of the present invention, the scanning electron microscope comprises a stage for two-dimensionally moving a sample of which surface is scanned with an electron beam, a track ball for setting as desired a moving direction of the stage and a device for limiting the moving direction of the stage only to a predetermined direction. The stage is moved in said predetermined direction while said limiting device operates.

DETAILED DESCRIPTION OF PREFERRED EMBODIMENTS

One embodiment that incorporates the features of the first to fourth scanning electron microscopes of the present invention will be described below with reference to the accompanying drawings.

Figure 1:
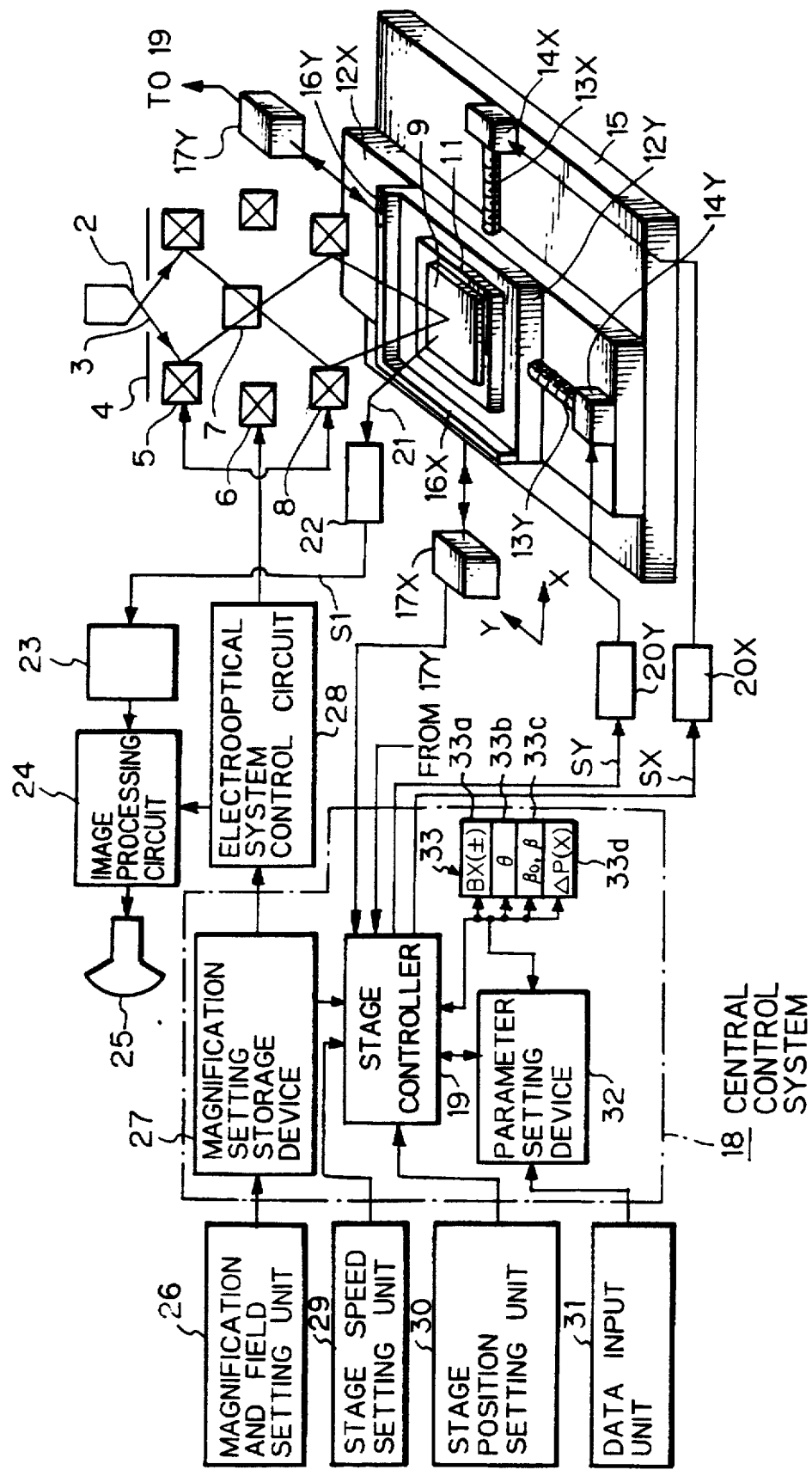
FIG. 1 is a block diagram partly containing a perspective view, showing one embodiment of the scanning electron microscope according to the present invention.

FIG. 1 shows a mechanical part and control system of a scanning electron microscope according to this embodiment. Referring to FIG. 1, an electron gun 2, which is disposed in the top of the scanning electron microscope, emits an electron beam 3. The electron beam 3 passes through an aperture 4 and is then converged by a converging lens 5. Thereafter, the electron beam 3 is deflected in directions X and Y by X- and Y-deflecting coils 6 and 7, respectively. It should be noted that two orthogonal directions on a plane perpendicular to the optical axis of the electro-optical system are herein defined as directions X and Y, respectively.

The electron beam 3, which has been deflected in the two directions, is further passed through an objective lens 8 so as to converge on the surface of a sample 9 in a sample chamber (not shown), thereby scanning a predetermined region of the sample surface. The sample 9 is placed on a sample holder 11 which, in turn, is mounted on a Y-stage 12Y. The Y-stage 12Y is placed on an X-stage 12X and engaged with a feed screw 13Y which extends in the direction Y. The Y-stage 12Y can be driven to move in the direction Y by rotating the feed screw 13Y in forward and backward directions with a pulse motor (i.e. stepping motor) 14Y. Further, the X-stage 12X is placed on a base 15 and engaged with a feed screw 13X which extends in the direction X. The X-stage 12X can be driven to move in the direction X by rotating the feed screw 13X in forward and backward directions with a pulse motor 14X. In this embodiment, the pulse motors 14X and 14Y are driven by respective movement control units 20X and 20Y for microstep drive control. That is, the pulse motors 14X and 14Y are driven by a microstep drive control method (detailed later).

In addition, a moving mirror 16X having a reflecting surface perpendicular to the X-axis is secured to the Y-stage 12Y, and a moving mirror 16Y having a reflecting surface perpendicular to the Y-axis is also secured to the Y-stage 12Y. Thus, the Y-coordinate of the sample holder 11 is measured by a combination of a laser interferometer 17X and the moving mirror 16X, and the X-coordinate of the sample holder 11 is measured by a combination of a laser interferometer 17Y and the moving mirror 16Y. The coordinates (X, Y) measured by the laser interferometers 17X and 17Y are supplied to a stage controller 19 in a central control system 18 which generally controls the operation of the entire apparatus.

It should be noted that, in this embodiment, the stages 12X and 12Y are driven at a moving step close to the measuring resolution of the laser interferometers by a microstep drive control method; therefore, it is not always necessary to provide the laser interferometers 17X and 17Y. In this embodiment, therefore, measured values obtained by the laser interferometers 17X and 17Y are mainly used for monitoring to check whether or not the moving speed or position of the stage 12X or 12Y has deviated from the specified speed or position because of the step-out of the pulse motor 14X or 14Y.

Further, a secondary electron detector 22 is disposed obliquely above the sample 9 to detect secondary electrons 21 emitted from the surface of the sample 9 as a result of irradiation with the electron beam 3. A detected signal S1 from the secondary electron detector 22 is passed through an amplifier 23 and an analog-to-digital converter (not shown) and then stored as image data in a frame memory provided in an image processing circuit 24. The image processing circuit 24 is also supplied with information indicating an observation field, together with a synchronizing signal corresponding to the electron beam scanning, from an electro-optical system control circuit 28. The image processing circuit 24 reads out image data corresponding to the observation field from the frame memory, and supplies it, together with the scanning synchronizing signal, to a CRT display 25. The display screen of the CRT display 25 displays an enlarged image of an object in the observation field on the sample 9 at a predetermined magnification. The display screen of the CRT display 25 also displays information for designating a magnification, a moving direction of the observation field, etc.

To use the scanning electron microscope, the operator needs to set a magnification, an observation field, etc. Therefore, the following units are connected to the central control system 18 in this embodiment: a magnification and field setting unit 26 for setting a magnification, a rotational angle of observation field, and an observation field; a stage speed setting unit 29 for setting a moving speed and moving direction of the stages 12X and 12Y; a stage position setting unit 30 for setting a moving direction and moving distance of the stages 12X and 12Y; and a data input unit 31 for inputting an amount of backlash of the stages 12X and 12Y and other data, as described later.

More specifically, the magnification and field setting unit 26 comprises a keyboard and a mouse. The operator sets the numerical value of an observation magnification displayed on the CRT display 25 by keying in it from the keyboard, and also sets a rotational angle of observation field by a key-in operation. Further, the operator cuts a desired portion from the magnified sample image displayed on the display screen of the CRT display 25 by a mouse operation to thereby set an observation field. The signals from the keyboard and the mouse are supplied to a magnification setting storage device 27 in the central control system 18. The magnification setting storage device 27 stores information concerning the designated magnification and rotational angle, together with positional information concerning the contour of the set observation field, in its internal memory, and supplies the information concerning the magnification, rotational angle and observation field to the electro-optical system control circuit 28.

The electro-optical system control circuit 28 outputs control signals corresponding to the designated magnification and observation field rotational angle to an electro-optical system which comprises the X- and Y-deflecting coils 6 and 7, etc. The electro-optical system control circuit 28 also outputs a synchronizing signal synchronized with a control signal for scanning of the electron beam by the X- and Y-deflecting coils 6 and 7, together with the observation field information, to the image processing circuit 24. The electron beam scans across a scanning range, which corresponds to the magnification, on the sample 9, and rotates the electron beam scanning direction through the designated rotational angle. Consequently, a sample image is displayed as a magnified image on the CRT display 25 at the magnification designated by the operator and in the state of being rotated through the designated rotational angle.

The image that is first displayed on the display screen of the CRT display 25 is, for example, a magnified image of substantially the entire scan region on the sample 9 which is scanned with the electron beam, and a magnified image of a partial region selected from the scan region is cut by a mouse operation. In this embodiment, a region on the sample 9 which corresponds to the magnified image displayed on the display screen of the CRT display 25 is referred to as "observation field". Accordingly, when a predetermined portion is cut from the magnified image of the entire scan region, a variable partial region on the sample 9 which corresponds to the cut portion is the observation field. Cutting of an image is effected by reading out image data for a range which corresponds to the designated observation field from the frame memory in the image processing circuit 24.

The stage speed setting unit 29 comprises a combination of a joy stick and a keyboard. When the operator controls the joy stick serving as the stage speed setting unit 29, signals indicating a moving direction and moving speed of the stages 12X and 12Y are supplied to the stage controller 19. The stage controller 19 drives the stages 12X and 12Y at the designated speed through the movement control units 20X and 20Y. Such constant-speed movement of the sample stage (12X and 12Y) is carried out, for example, when the operator desires to move the observation field in the desired direction while observing a magnified sample image displayed on the CRT display 25. The operator can also directly inputs a stage moving direction and moving speed through the keyboard serving as the stage speed setting unit 29. It should be noted that an input device, for example, a track ball, may be used in place of the joy stick.

Meanwhile, the stage position setting unit 30 comprises a mouse and a keyboard. For example, the operator designates a point (move point) away from the magnified image presently displayed on the CRT display 25 by a mouse operation. Information concerning the move point, together with information concerning the present observation magnification and observation field from the magnification setting storage device 27, is supplied to the stage controller 19. The stage controller 19 calculates a direction and distance from the center of the present observation field to the move point. Then, the stage controller 19 moves the stages 12X and 12Y by the calculated distance in the calculated direction through the movement control units 20X and 20Y. Thus, the center of the observation field moves to the position designated by the operator.

Further, the apparatus in this embodiment is arranged such that, when the operator inputs a command to move the stage by 10 mm in the direction X, for example, from the keyboard serving as the stage position setting unit 30, the stage controller 19 rotates the pulse motor 14X through a rotational angle corresponding to 10 mm through the movement control unit 20X in response to the input command.

Next, the data input unit 31 comprises a keyboard. After the amount of backlash in each of the stages 12X and 12Y and the pitch error in each of the feed screws 13X and 13Y have been measured, the operator inputs the measured backlash and pitch error to a parameter setting device 32 in the central control system 18 through the data input unit 31. In response to the input operation, the parameter setting device 32 stores the amount of backlash and the pitch error in a backlash storage region 33a and a pitch error storage region 33d, respectively, in a memory 33. Thereafter, the stage controller 19 makes correction on the basis of the amount of backlash and pitch error read out from the memory 33 when the stages 12X and 12Y are to be driven. In addition, the stage controller 19 writes information concerning the advance direction, observation magnification, rotational angle of observation field, etc., so far set, to the memory 33 through the parameter setting device 32.

It should be noted that the magnification setting storage device 27, the stage controller 19 and the parameter setting device 32, which are provided in the central control system 18 in this embodiment, are functions which are executed by software of a computer.

Next, the micro-step drive control of the pulse motors 14X and 14Y in this embodiment will be explained in detail.

In general, pulse motors (stepping motors) rotate and stop for each step angle which is determined by a salient-pole structure of a rotor and a stator, and hence make it possible to effect positioning control with high accuracy and with ease in comparison to DC motors or AC motors. On the other hand, pulse motors have such characteristics that, since they rotate for each step angle, the rotor speed varies, causing resonance to occur or vibration to increase at a certain number of revolutions.

In this regard, micro-step drive control is a technique in which the basic step angle of a pulse motor is subdivided by controlling the current passed through the motor coils, thereby realizing ultra-low speed drive, low-vibration drive, and low-noise operation, and also improving the positioning resolution, and thus enabling the positioning accuracy to be further improved.

Figure 2A:
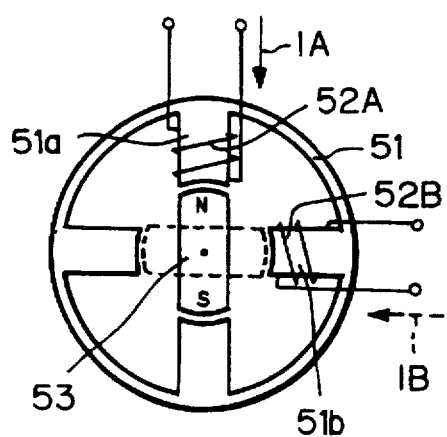
FIG. 2(a) shows the way in which a pulse motor is driven by a full-step drive control method.

More specifically, FIG. 2(a) shows a two-phase pulse motor having a basic step angle of 90°. Referring to FIG. 2(a), a stator 51 is formed from a magnetic material having four projections provided at intervals of 90°. A rotor 53, which is a magnet formed with opposite magnetic poles, is rotatably disposed in the stator 51 so as to face the projections. One projection 51a of the stator 51 is wound with a coil 52A, and a projection 51b which is adjacent to the projection 51a is wound with a coil 52B.

When the pulse motor shown in FIG. 2(a) is to be driven by full-step drive control, the current IA which is to be passed through one coil 52A is set to a positive maximum value $I_0$, and the current IB which is to be passed through the other coil 52B is set to 0. Consequently, the rotor 53 comes to rest at a position where it faces the projection 51a, as shown by the solid line. Next, the current IA is set to 0, and the other current IB is set to a positive maximum value $I_0$. Consequently, the rotor 53 rotates through 90° and comes to rest at a position where it faces the projection 51b, as shown by the dotted line. By alternately exciting the currents IA and IB in this way, the rotor 53 is caused to rotate with a basic step angle of 90°.

Figure 2B:
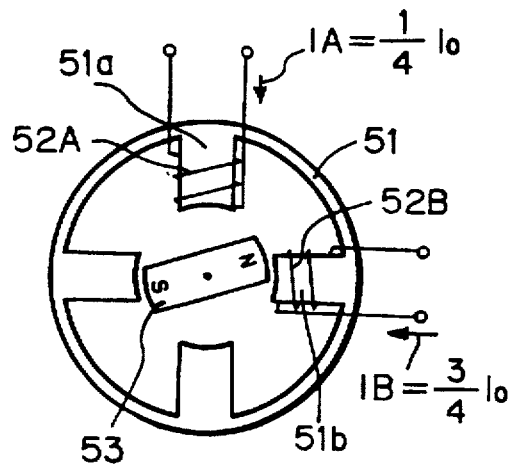
FIG. 2(b) shows the way in which a pulse motor is driven by a micro-step drive control method.

Next, when the pulse motor shown in FIG. 2(a) is to be driven by micro-step drive control, the ratio of the current IA to the current IB is gradually changed. For example, when the current IA is $(¼)I_0$ and the current IB is $(¾)I_0$, as shown in FIG. 2(b), the rotor 53 comes to rest after rotating through approximately $(¾) \times 90°$ from the projection 51a toward the projection 51b. Accordingly, the smallest step angle can be limitlessly reduced in principle by finely setting the ratio of the current IA to the current IB. This is micro-step drive control.

In this embodiment, a five-phase pulse motor having a basic step angle $\phi$ of 0.72° is used as one example of the pulse motors 14X and 14Y. Further, the basic step angle is subdivided into about 100 step angles by the micro-step drive control. An example of the arrangement of the movement control units 20X and 20Y for the micro-step drive control which is used in this embodiment will be explained below.

Figure 3:
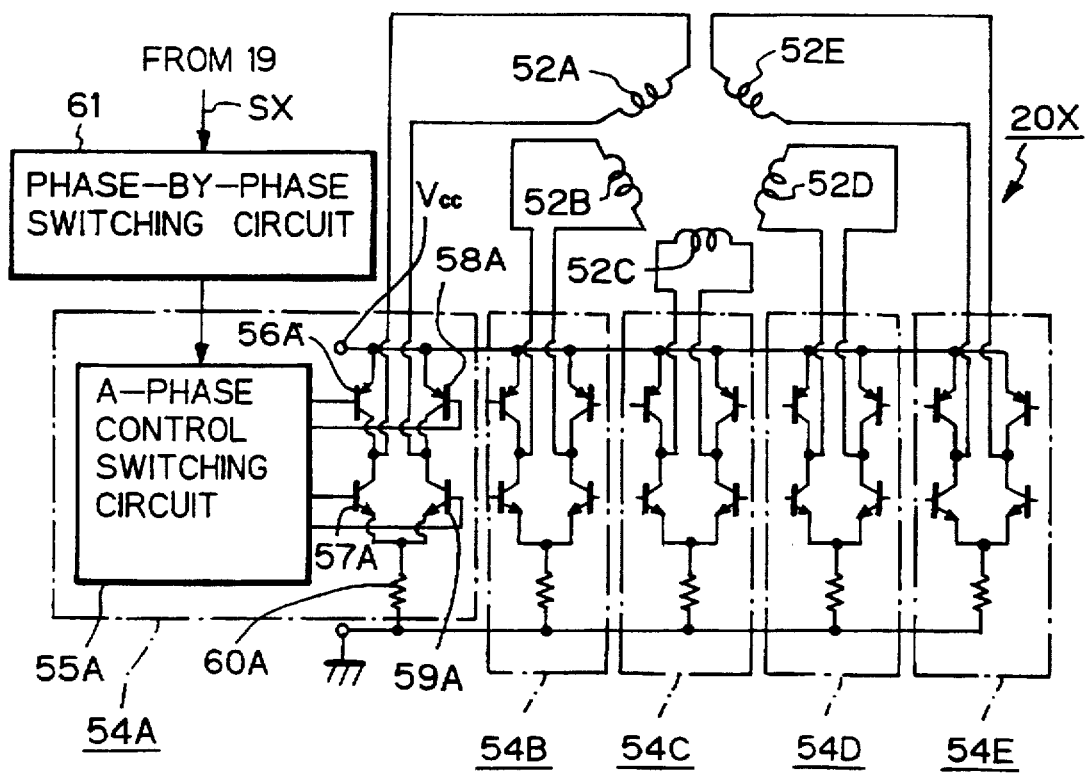
FIG. 3 illustrates the connection of coils of a pulse motor shown in FIG. 1, and also shows the arrangement of one example of a movement controller for micro-step drive control.

FIG. 3 shows five-phase coils 52A to 52E of the pulse motor 14X for the X-axis, and the movement control unit 20X for controlling the current to be supplied through each of these coils. Referring to FIG. 3, the coils 52A to 52E are connected with current control circuits 54A to 54E having the same arrangement for supplying currents thereto independently of each other.

For example, in the current control circuit 54A for the A-phase, the emitters of pnp-type transistors 56A and 58A are connected to a power supply terminal to which a DC voltage $V_{cc}$ is applied, and the coil 52A is connected between the collectors of the transistors 56A and 58A. In addition, the collector of an npn-type transistor 57A is connected to the collector of the transistor 56A, and the collector of an npn-type transistor 59A is connected to the collector of the transistor 58A. The emitters of the transistors 57A and 59A are connected in common to one end of a resistor 60A. The other end of the resistor 60A is grounded. The bases of the transistors 56A, 57A, 58A and 59A and the one end of the resistor 60A are connected to an A-phase control switching circuit 55A. The A-phase control switching circuit 55A controls the current flowing through each of the transistors 56A, 57A, 58A and 59A.

The current control circuits 54B to 54E for the other coils 52B to 52E also include respective control switching circuits (not shown) having the same arrangement as that of the A-phase control switching circuit 55A.

A control signal SX from the stage controller 19, shown in FIG. 1, is supplied to a phase-by-phase switching circuit 61 shown in FIG. 3. The phase-by-phase switching circuit 61 controls the switching and current control operation of each control switching circuit (55A, etc.) in the current control circuits 54A to 54E so that the pulse motor 14X rotates through a rotational angle corresponding to a distance designated by the control signal SX. Consequently, the pulse motor 14X rotates in the designated direction through the rotational angle designated in units of the smallest step angle of 0.72°/100. The movement control unit 20Y for the Y-axis pulse motor 14Y also has the same arrangement as that of the movement control unit 20X for the X-axis.

Figure 4:
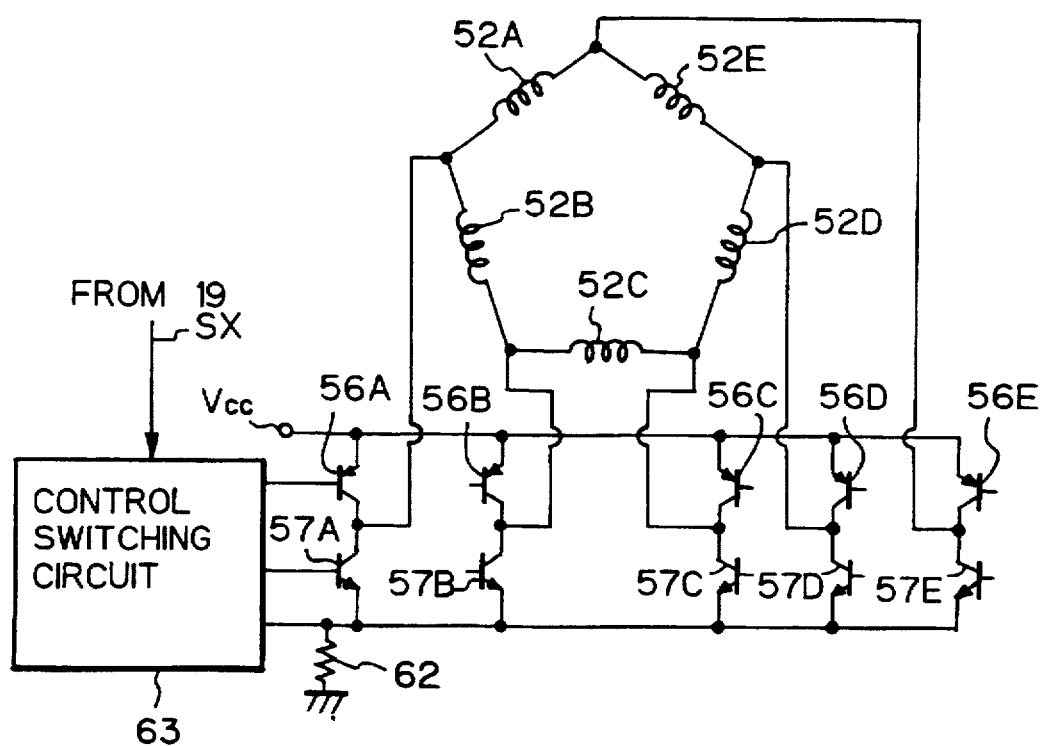
FIG. 4 illustrates the connection of coils of a pulse motor shown in FIG. 1, and also shows the arrangement of another example of a movement controller for micro-step drive control.

It should be noted that the arrangement of the movement control units for the pulse motors 14X and 14Y is not necessarily limited to the example shown in FIG. 3, and that the movement control units may be arranged as shown in FIG. 4.

FIG. 4 shows five-phase coils 52A to 52E of the pulse motor 14X and also illustrates the arrangement of another example of the movement control unit 20X for controlling the current to be passed through each of these coils. Referring to FIG. 4, the coils 52A to 52E are serially connected so as to form a closed loop. The emitters of pnp-type transistors 56A to 56E are connected in common to a power supply terminal to which a DC voltage $V_{cc}$ is applied. One end of each of the coils 52A to 52E is connected to the collector of the corresponding transistor (56A to 56E). In addition, the collectors of npn-type transistors 57A to 57E are connected to the respective collectors of the transistors 56A to 56E. The emitters of the transistors 57A to 57E are connected in common to one end of a resistor 62. The other end of the resistor 62 is grounded. The bases of the transistors 56A to 56E and 57A to 57E and the one end of the resistor 62 are connected to a control switching circuit 63. The control switching circuit 63 controls the current flowing through each of the transistors 56A to 56E and 57A to 57E.

In this case, a control signal SX from the stage controller 19, shown in FIG. 1, is supplied to the control switching circuit 63, shown in FIG. 4. The control switching circuit 63 controls the current flowing through each of the coils 52A to 52E so that the pulse motor 14X rotates through a rotational angle corresponding to the distance designated by the control signal SX. Consequently, the pulse motor 14X rotates in the designated direction through the rotational angle designated in units of the smallest step angle of 0.72°/100.

Referring to FIG. 1, the feed screws 13X and 13Y in this embodiment are assumed to be ball screws having a lead of 5 mm (i.e. 5 mm pitch). As the pulse motors 14X and 14Y, five-phase pulse motors having a basic step angle $\phi$ of 0.72° are used, as described above. The pulse motors 14X and 14Y are driven by the micro-step drive control method with the basic step angle $\phi$ divided into 100 step angles. Accordingly, the feed resolution p of the stages 12X and 12Y is 0.1 µm as given by $$p=5/(100\cdot360/0.72)=1\times10^{-4}[mm] \tag{1}$$

Assuming that the sample observation magnification is 100,000, the width of the observation field on the sample 9 is determined to be 1.8 µm, for example, from the relationship between the electron beam scanning region and the observation magnification. Thus, since the feed resolution p of the stages 12X and 12Y is 0.1 µm, the observation field can be smoothly moved.

In contrast, if the pulse motors 14X and 14Y are driven on the basis of half-step drive control by 4–5 phase excitation as in the conventional practice, the smallest step angle is 0.36°, and therefore, the feed resolution of the stages 12X and 12Y is 5 µm. Accordingly, the observation field having a width of 1.8 µm cannot smoothly be moved by the conventional method.

Figure 5:
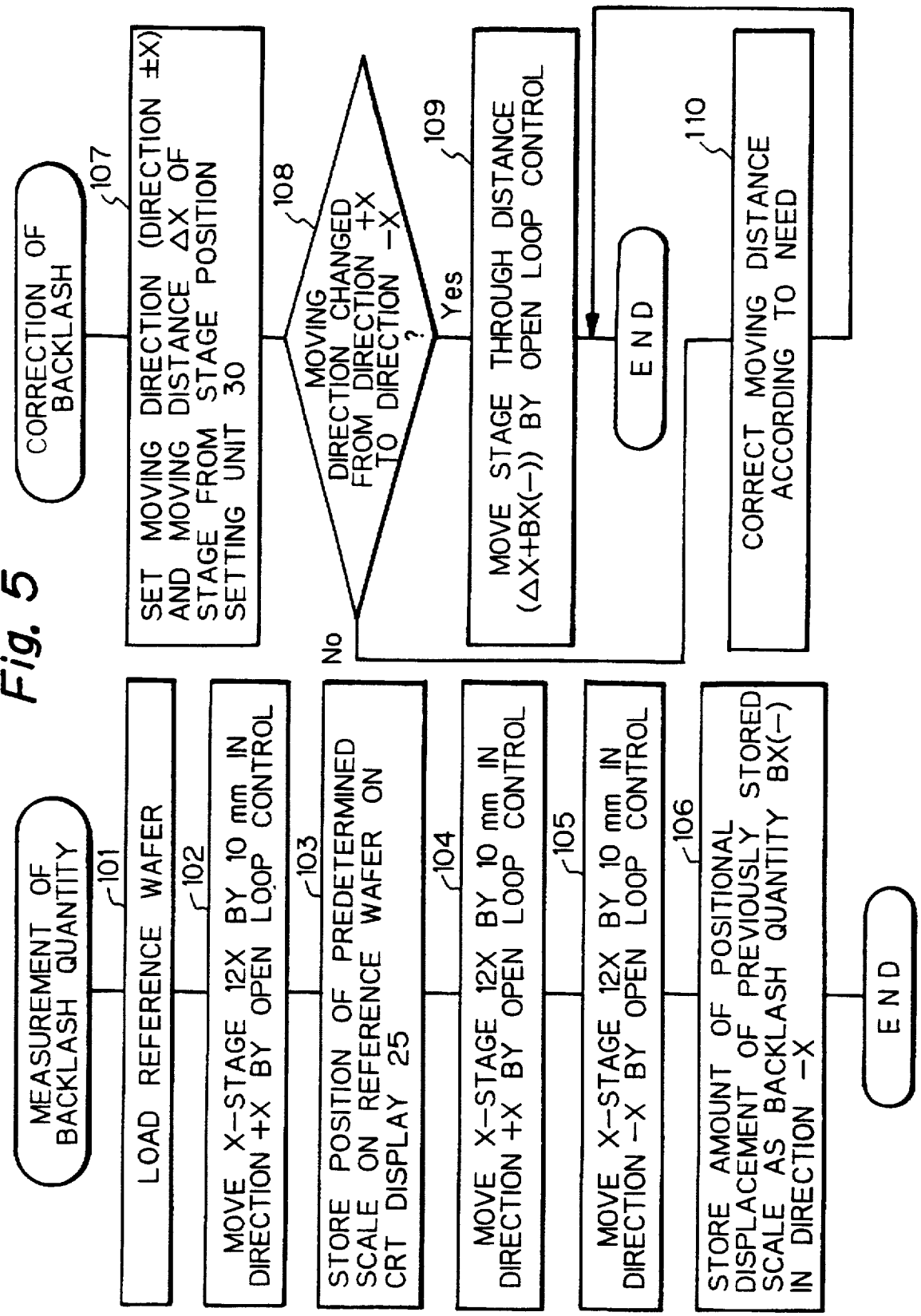
FIG. 5 is a flowchart showing one example of a backlash correcting method employed in the embodiment.

Next, an operation of correcting the backlash in the stages 12X and 12Y in this embodiment will be explained with reference to the flowchart of FIG. 5. First, at step 101 in FIG. 5, a reference wafer is placed on the sample holder 11 in FIG. 1. The reference wafer is prepared to confirm the amount of movement of the stage. The reference wafer has scales (marks) previously formed thereon at predetermined intervals so as to serve as references for position in the directions X and Y.

For example, to measure a backlash quantity in the direction X, at step 102, the operator issues a command from the stage position setting unit 30 to the stage controller 19 so as to move the X-stage 12X in the direction +X by 10 mm (more precisely, 10.0000 mm; the same shall apply hereinafter) from the present position. In response to the command, the pulse motor 14X rotates through an angle corresponding to 10 mm under the micro-step drive control. Thereafter, at step 103, the operator stores in memory an appropriate scale image position on the reference wafer which is being displayed on the CRT display 25. In this case, a predetermined index mark is displayed on the display screen of the CRT display 25, and the distance from the index mark to the selected scale image, for example, is recorded.

Next, at step 104, the operator moves the X-stage 12X by 10 mm again in the direction +X by open loop control through the stage position setting unit 30. Thereafter, at step 105, the operator moves the X-stage 12X by 10 mm in the direction –X by open loop control through the stage position setting unit 30. Subsequently, at step 106, the operator measures the amount of displacement between the scale image position of the reference wafer previously stored and the present scale image position on the display screen of the CRT display 25. At this time, the amount of deviation of the scale image position from the index mark in the direction +X, obtained at step 103, is subtracted from the amount of deviation of the present scale image position from the index mark in the direction +X, and the length (actual length on the display screen) obtained as a result of the subtraction is divided by the observation magnification. The value obtained by the division is defined as a backlash quantity BX(–) in the direction –X.

Since the observation magnification is 100,000, for example, the backlash quantity BX(–) is accurately obtained on the order of 0.1 µm, for example. The operator stores the backlash quantity BX(–) in the backlash storage region 33a, which is provided in the memory 33, through the data input unit 31 and the parameter setting device 32. Similarly, a backlash quantity BX(+) which is observed when the moving direction of the X-stage 12X is turned from the direction –X to the direction +X is measured, and the measured backlash quantity BX(+) is stored in the backlash storage region 33a. Further, a backlash quantity BY(–) which is observed when the Y-stage 12Y is turned to the direction –Y is stored in the backlash storage region 33a, and a backlash quantity BY(+) observed when the Y-stage 12Y is turned to the direction +Y is also stored in the backlash storage region 33a.

Next, the sample stage is controlled by using the obtained backlash quantities as follows: First, at step 107 in FIG. 5, the operator sets a moving direction (direction ±X) and moving distance ΔX of the X-stage 12X, for example, to the stage controller 19 from the stage position setting unit 30. At this time, information indicating the moving direction of the X-stage 12X immediately before the present time has previously been stored in the backlash storage region 33a by the stage controller 19. Thereafter, at step 108, the stage controller 19 checks whether or not the designated moving direction of the X-stage 12X has changed from the direction +X to the direction –X. If Yes is the answer at step 108, the pulse motor 14X is rotated, at step 109, by open loop control through an angle corresponding to a moving distance (ΔX+ BX(–)) obtained by adding the stored backlash quantity BX(–) to the supplied moving distance ΔX. Consequently, the backlash is effectively corrected, and thus the X-stage 12X accurately moves by ΔX in the direction –X.

If the moving direction changes from the direction –X to the direction +X at step 108, the control operation shifts to step 110, at which the moving distance ΔX is corrected on the basis of the backlash quantity BX(+). When there is no change in the moving direction, the moving distance ΔX is used as it is. Assuming that the backlash quantity is 1 μm, for example, the backlash can be accurately corrected in this embodiment because the positioning resolution of the X-stage 12X is raised to the order of 0.1 μm by driving the pulse motor 14X by the micro-step drive control method.

In contrast to the above, it has been difficult with the conventional sample stage to correct the backlash even if the backlash quantity is measured. For example, even if the sample stage is equipped with ball screws having a lead of 5 mm, and each ball screw is driven with a five-phase pulse motor by 4–5 phase excitation under half-step drive control, the positioning resolution is 5 μm per step. Accordingly, if the backlash quantity is of the order of 1 μm, it cannot be corrected by the half-step drive control method.

Next, one example of an operation performed when the observation field on the sample 9 is to be rotated in this embodiment will be explained with reference to FIGS. 6(a) to 9(d). First, in FIG. 1, the sample 9 is placed on the sample holder 11, and an observation image of the sample 9 is displayed on the CRT display 25.

Figure 6A:
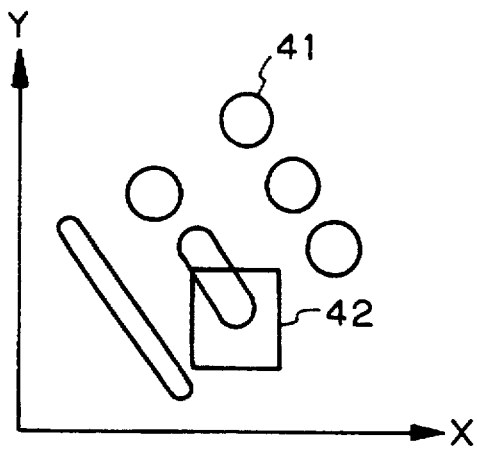
FIGS. 6(a) and 6(b) show an observation field on a sample, and a magnified image thereof.
Figure 6B:
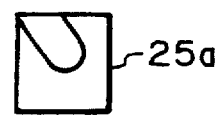

FIG. 6(a) shows an observation field 42 set on the sample 9 at that time. In FIG. 6(a), a rectangular observation field 42 is set over patterns 41 on the sample 9. FIG. 6(b) shows the display screen 25a of the CRT display 25 shown in FIG. 1. A magnified image of a pattern in the observation field 42 is displayed on the display screen 25a. Accordingly, assuming that the magnification is β, the actual size of the observation field 42 in FIG. 6(a) is 1/β of the size of the display screen 25a shown in FIG. 6(b).

Figure 7A:
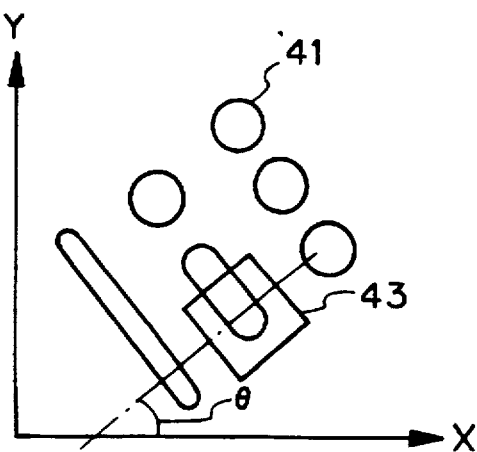
FIGS. 7(a) and 7(b) show a magnified image observed when an observation field is rotated in the embodiment.
Figure 7B:
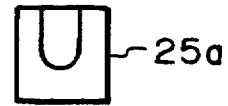

Next, the operator rotates the observation field 42 on the sample 9 through an angle θ (θ herein assumed to be 45°) counterclockwise from the X-axis through the magnification and field setting unit 26 shown in FIG. 1. Consequently, the electron beam scanning direction on the sample 9 rotates through 45° by the action of the magnification setting storage device 27. As a result, a rectangular observation field 43 is set in parallel to a direction which is counterclockwise tilted at 45° with respect to the direction X over the patterns 41 on the sample 9, as shown in FIG. 7(a). Further, the angle θ is stored in a rotational angle storage region 33b, which is provided in the memory 33, through the stage controller 19. Consequently, a magnified image of a pattern in the observation field 43 is displayed on the display screen 25a, as shown in FIG. 7(b). The magnified image is displayed in such a manner that the sides of the rectangular observation field 43 are parallel or perpendicular to the sides of the display screen 25a.

Next, if it is desired to observe a region lying rightward of the right side of the magnified image shown in FIG. 7(b), the operator issues a command to move the stages 12X and 12Y, on which the sample 9 is placed, at a predetermined speed in the direction −X through the stage speed setting unit 29. In response to the command, the stage controller 19 reads out the angle θ from the rotational angle storage region 33b of the memory 33, and drives the stages 12X and 12Y to move at a predetermined speed in a direction rotated through an angle (180° −θ) clockwise with respect to the direction +X. This is done, for example, by moving the Y-stage 12Y by ΔX.tan θ in the direction −Y as the X-stage 12X moves by ΔX in the direction −X.

Figure 8A:
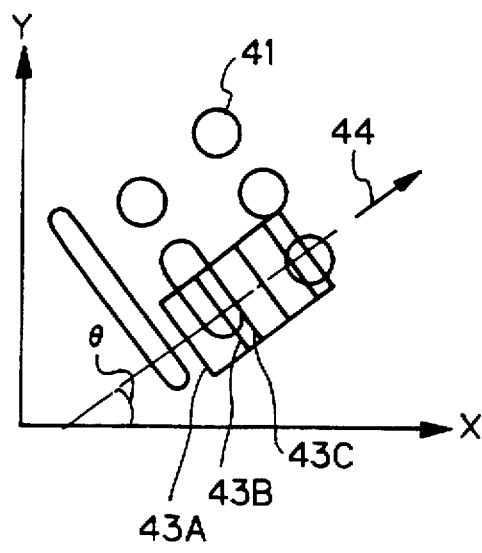
FIGS. 8(a), 8(b), 8(c) and 8(d) illustrate an operation performed when a rotated observation field is horizontally moved in the embodiment.
Figures 8B, 8C:
Figure 8D:
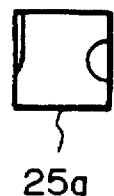

As a result, as shown in FIG. 8(a), the observation field moves over the patterns 41 on the sample 9 from a region 43A through a region 43B to a region 43C . . . along a direction 44 which is counterclockwise tilted at an angle θ with respect to the direction +X. As the observation field successively moves through the regions 43A, 43B and 43C, magnified images such as those shown in FIGS. 8(b), 8(c) and 8(d) are successively displayed on the display screen 25a of the CRT display 25. Accordingly, this embodiment enables the observation field to be moved in a set direction on the basis of the magnified image displayed on the display screen 25a by a mechanical field moving method independently of the amount of rotation of the observation field even when it is electrically rotated.

In this case, the pulse motors 14X and 14Y are driven by the micro-step drive control method, and thus the feed resolution of the stages 12X and 12Y is of the order of 0.1 μm, for example. Therefore, even if the width of the observation field is 1.8 μm, for example, the observation field can be smoothly moved.

Comparison will now be made between the conventional technique and this embodiment. In the conventional technique, if the operator controls the system so as to move the observation field in the direction +X while observing the magnified image as shown in FIG. 7(b), for example, the X-stage 12X moves in the direction −X irrespective of the rotational angle of the observation field. Consequently, the observation field moves in a diagonal direction.

Figure 9A:
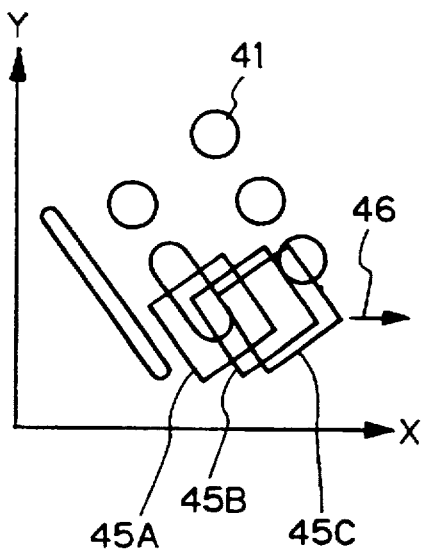
FIGS. 9(a), 9(b), 9(c) and 9(d) illustrate an operation performed when a rotated observation field is horizontally moved in a conventional technique.
Figures 9B, 9C:
Figure 9D:

FIG. 9(a) shows the way in which a rotated observation field is moved by using the conventional technique. In FIG. 9(a), the observation field moves over the patterns 41 on the sample 9 from a region 45A through a region 45B to a region 45C . . . along the direction +X. As the observation field successively moves through the regions 45A, 45B and 45C, magnified images such as those shown in FIGS. 9(b), 9(c) and 9(d) are displayed on the display screen 25a of the CRT display 25. That is, the observation field undesirably moves in a direction which is not conformable to the operator's intention. This problem arises because the operation of the stages 12X and 12Y does not follow up information concerning the rotation of the observation field on the sample 9 when it has been electrically rotated.

In the conventional technique, further, even if the sample stage is moved with the angle corrected by an amount corresponding to the rotational angle of the observation field in order to move the sample observation image independently of the amount of rotation of the observation field, it has been difficult to move the image smoothly when the observation magnification is high. For example, even if ball screws having a lead of 5 mm are used as the feed screws 13X and 13Y, and the pulse motors 14X and 14Y are driven by 4–5 phase excitation under half-step drive control, the positioning resolution is 5 μm per step. On the other hand, the width of the observation field is 1.8 μm, for example. Therefore, the observation field cannot smoothly be moved.

Figure 10:
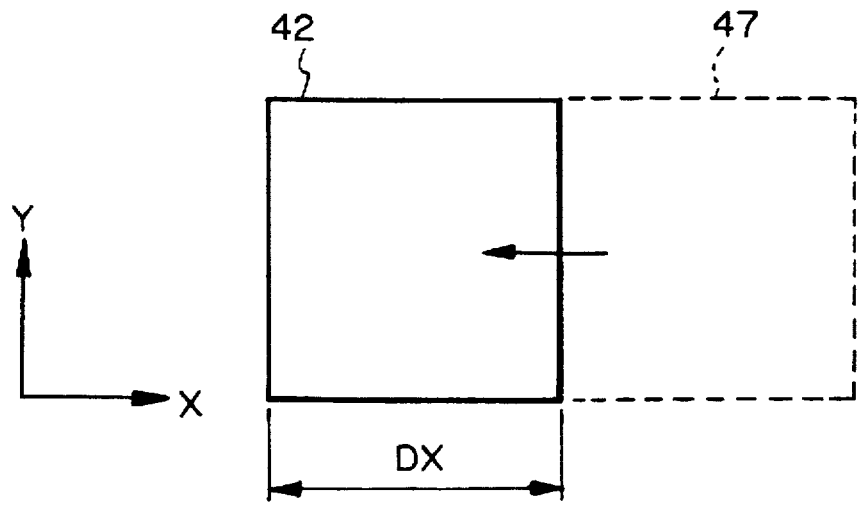
FIG. 10 shows the way in which an observation field is moved at a constant speed on a display screen.

The following is a description of one example of an operation performed in this embodiment when the observation field is to be moved after the observation magnification has been changed. First, the operator determines a speed at which the sample observation image is to be moved within the effective field range in the display screen of the CRT display 25 through the stage speed setting unit 29. For example, a moving speed is set so that the sample observation image moves across the effective field range in a time period T (T is 3 seconds, for example, in this embodiment). Assuming that the observation field on the sample 9 is an observation field 42 having a width DX in the direction X, as shown in FIG. 10, and that the observation field 42 is to be moved toward a region 47 which is adjacent to the present position in the direction +X in a time period T, the moving speed of the X-stage 12X is set at a speed DX/T in the direction −X. The observation magnification at this time is assumed to be $\beta_0$ ($\beta_0$ is 10,000, for example). The observation magnification $\beta_0$ has been stored in a magnification storage region 33c, which is provided in the memory 33.

Next, if the operator changes the observation magnification to $\beta$ ($\beta$ is 20,000, for example) through the magnification and field setting unit 26, the observation magnification $\beta$ after the magnification change is stored into the magnification storage region 33c in the memory 33. The magnification storage region 33c has also been stored with the previous observation magnification $\beta_0$. Thereafter, if the operator designates only a moving direction of the observation field from the keyboard serving as the stage speed setting unit 29, the stage controller 19 drives the stages 12X and 12Y to move by the micro-step drive control method so that the moving speed of the image displayed on the display screen of the CRT display 25 is equal to the image moving speed at the previous observation magnification.

More specifically, assuming that the observation field 42 is to be moved in the direction +X in FIG. 10, the stage controller 19 drives the X-stage 12X in the direction −X at a speed V($\beta$) which is determined by $$V(\beta)=(DX/T)\beta_0/\beta \qquad (2)$$

Consequently, the sample observation image moves across the effective field range on the display screen of the CRT display 25 in a time period T. Accordingly, in this embodiment, a magnified image of the sample moves at a constant speed on the display screen independently of the observation magnification, and thus the controllability improves.

In the case of the conventional technique, however, once the stage moving speed is set at the beginning, the stage moving speed is maintained at the first set value thereafter. Therefore, if the stage moving speed is first set so that the sample observation image moves across the effective field range, which is displayed at a magnification of 10,000 on the display screen, in 3 seconds, for example, when the observation magnification is changed to 20,000, the time required for the sample observation image to move across the effective field range becomes 1.5 seconds, and when the observation magnification is changed to 100,000, the required time becomes as short as 0.3 second. This is not convenient for the operator to move the sample observation image.

Further, it has been difficult with the conventional technique to move the sample observation image at a constant speed. For example, let us assume that the sample observation image is to move across the effective field range in 3 seconds, and the observation magnification at that time is 10,000. In this case, if the feed screws 13X and 13Y are ball screws having a lead of 5 mm, and the pulse motors 14X and 14Y are driven by 4–5 phase excitation under half-step drive control, the positioning resolution of the stages 12X and 12Y is 5 μm per step. Assuming that the width DX of the observation field on the sample 9 at a magnification of 10,000 is 18 μm from the relationship between the electron beam scanning width and the observation magnification, the number of steps at which the sample observation image can move across the effective field range is three. Therefore, the stage speed is set so that the sample stage moves three steps in 3 seconds. Next, if the observation magnification is set at 100,000, the width of the observation field becomes 1.8 μm. In this case, since the positioning resolution is 5 μm per step, when the sample stage is fed by one step, a totally different observation image is undesirably displayed on the CRT display 25. It will, therefore, be understood to be difficult to move the observation field across the effective field range in 3 seconds when the observation magnification is 100,000.

In contrast, if micro-step drive control is used as in this embodiment, the positioning resolution of the stages 12X and 12Y is 0.1 μm. Therefore, the observation field can be moved at a constant speed even if the observation magnification is 100,000.

Next, one example of an operation performed in this embodiment when the pitch errors in the feed screws 13X and 13Y are to be corrected will be explained. First, a reference wafer is placed on the sample holder 11 in FIG. 1. The reference wafer has scales formed thereon in advance as a reference for moving distance in order to confirm the amount of movement of the sample stage. The scales have previously been calibrated by a high-precision laser interferometer or the like. Pitch error quantities of the feed screws 13X and 13Y can be measured by comparing the amounts of movement of the stages 12X and 12Y through the pulse motors 14X and 14Y with the reference wafer.

For example, let us assume that the X-stage 12X is to be moved by 5.0 mm in the direction +X from a position where the X-coordinate is 0.0 mm by open loop control. At this time, the system is set so that a reference scale of 0.0 mm comes to the vicinity of the central index mark on the display screen of the CRT display 25 when the X-coordinate is 0.0 mm, and the amount of positional displacement between the index mark and the reference scale is read. Next, the pulse motor 14X is driven by the micro-step drive control method to move the X-stage 12X by 5.0 mm in the direction +X. Consequently, a reference scale of 5.0 mm of the reference wafer is displayed on the CRT display 25. Therefore, the amount of deviation of the reference scale of 0.0 mm, which has previously been read, is subtracted from the amount of deviation of the reference mark of 5.0 mm from the central index mark on the display screen, and the resulting difference is divided by the observation magnification. Thus, it is possible to obtain a pitch error $\Delta P(X)$ of the feed screw 13X in the X-coordinate range of from 0.0 mm to 5.0 mm. This operation is carried out every 5.0 mm with respect to the direction X, thereby enabling measurement of the pitch error $\Delta P(X)$ of the feed screw 13X for the direction X.

Figure 11:
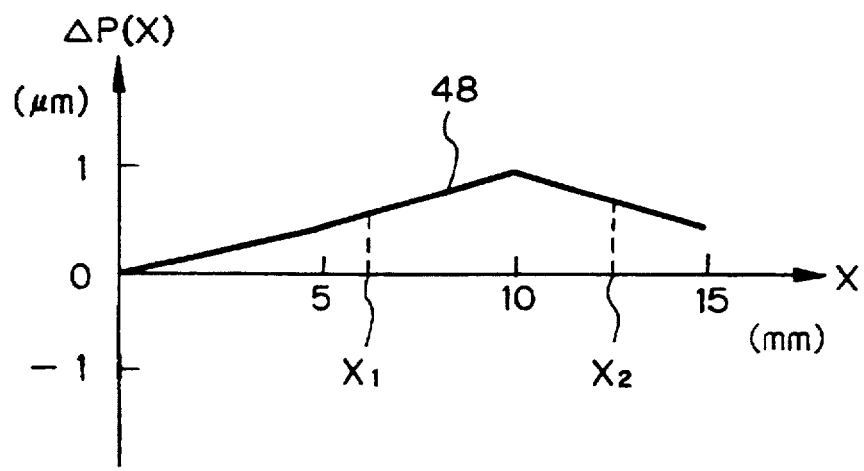
FIG. 11 shows one example of pitch error of a feed screw in the embodiment.

FIG. 11 shows one example of the pitch error $\Delta P(X)$ measured as described above. In FIG. 11, the pitch error $\Delta P(X)$ changes in the shape of a polygonal line 48 along the coordinate X. Similarly, the pitch error $\Delta P(Y)$ of the feed screw 13Y for the direction Y can be measured. The pitch errors $\Delta P(X)$ and $\Delta P(Y)$ are stored into the pitch error storage region 33d in the memory 33, shown in FIG. 1.

The sample stage is controlled by using the obtained pitch error quantities as follows: First, the operator sets a moving direction and moving distance of the stages 12X and 12Y to the stage controller 19 through the stage position setting unit 30. The stage controller 19 calculates amounts by which the X- and Y-stages 12X and 12Y are to be moved from the set moving direction and moving distance, and then corrects the calculated amounts of movement by using the pitch errors $\Delta P(X)$ and $\Delta P(Y)$ stored in the pitch error storage region 33d.

For example, when the X-stage 12X is to be moved from the position $X_1$ to the position $X_2$ in FIG. 11, the stage controller 19 adds the pitch error difference ($\Delta P(X_2)-\Delta P(X_1)$) to the amount of movement ($X_2-X_1$) obtained by calculation. Then, the stage controller 19 drives the pulse motor 14X by the corrected amount of movement by micro-step drive control and open loop control. Consequently, the X-stage 12X accurately moves by the distance ($X_2-X_1$). Therefore, the observation field can be moved to the desired position on the sample independently of the adverse effect of the pitch error of the feed screw 13X.

In the case of the conventional sample stage, however, even if the pitch error of the feed screw is measured, it is difficult to correct the pitch error. The reason for this is that the pitch error is generally smaller than the positioning resolution of the conventional sample stage; therefore, the pitch error cannot be corrected by open loop control.

However, if micro-step drive control is employed as in the case of this embodiment, even if the pitch error of the feed screws 13X and 13Y is of the order of 1 μm, the pitch error can be accurately corrected because the positioning resolution of the sample stage is of the order of 0.1 μm.

It should be noted that in the above-described embodiment, coordinate values (X, Y) measured by the laser interferometers 17X and 17Y are used to detect step-out of the pulse motors 14X and 14Y. However, a simpler detector (e.g., an optical linear encoder) may be used for the step-out detection. If the pulse motor operation is stable, there is no need of providing laser interferometers and associated devices.

According to the first to fourth scanning electron microscopes, a sample is positioned by a feed screw-driven stage which is moved by pulse motors controlled by the micro-step drive control method. Therefore, the sample positioning resolution can be made more than one order in magnitude smaller than the ordinary width of the observation field in the scanning electron microscopes. Accordingly, it is possible to carry out the following operations:

According to the first scanning electron microscope, even if there is backlash in a stage for positioning a sample, the observation field on the sample can be accurately moved to a desired position by a mechanical field moving method.

According to the second scanning electron microscope, the operator can move the observation field on the sample, which has been electrically rotated, toward a region which is adjacent to the present position on the sample by a mechanical field moving method while viewing the sample observation image displayed on the image display device, independently of the rotational angle of the observation field. Therefore, positioning of the observation field is easy.

According to the third scanning electron microscope, when the observation field is to be moved by a mechanical field moving method on the basis of the sample observation image displayed on the image display device, the sample observation image can be moved at a constant speed on the image display device independently of the sample observation magnification no matter how high it is.

Further, according to the fourth scanning electron microscope, even if there is a pitch error in a feed screw of a stage for positioning a sample, the observation field on the sample can be accurately moved to a desired position by a mechanical field moving method.

Next, one embodiment of the fifth scanning electron microscope according to the present invention will be described with reference to FIG. 12. The arrangement shown in FIG. 12 differs from the arrangement shown in FIG. 1 in the following points:

First, the central control system 18 in this embodiment is connected with: a magnification and field setting unit 26 for setting a magnification, a rotational angle of observation field, and an observation field; a stage speed setting unit 29 for setting a moving speed and moving direction of the stages 12X and 12Y; a stage position setting unit 30 for setting a moving direction and moving distance of the stages 12X and 12Y; and a field moving signal generator 131 for designating a moving direction of the observation field on the sample 9.

It should be noted that a magnification setting storage device 27 and a field moving quantity setting device 119, which are provided in the central control system 18, are functions which are executed by software of a computer.

The stage speed setting unit 29 is a joy stick. When the operator controls the stage speed setting unit 29, signals indicating a moving direction and moving speed of the stages 12X and 12Y are supplied to the field moving quantity setting device 119. The field moving quantity setting device 119 drives the stages 12X and 12Y at a designated speed through movement control units 20X and 20Y. It should be noted that an input device such as a track ball may be used in place of the joy stick.

Meanwhile, the stage position setting unit 30 comprises a mouse. For example, the operator designates a point (move point) away from the magnified image presently displayed on the CRT display 25 by a mouse operation. Information concerning the move point, together with information concerning the present observation magnification and observation field from the magnification setting storage device 27, is supplied to the field moving quantity setting device 119. The field moving quantity setting device 119 calculates a direction and distance from the center of the present observation field to the move point. Then, the field moving quantity setting device 119 moves the stages 12X and 12Y by the calculated distance in the calculated direction through the movement control units 20X and 20Y. Thus, the center of the observation field moves to the position designated by the operator.

Next, the field moving signal generator 131 comprises a push button and a two-dimensional joy stick (a track ball or the like is also usable). When it is desired to move the observation field to a region adjacent to the present position (this will hereinafter be referred to as "step movement" of the observation field), the operator first pushes the push button once, and then designates a field moving direction with the joy stick. A signal from the push button, together with a signal indicating the direction from the joy stick, is supplied to the field moving quantity setting device 119. In response to the signals, the field moving quantity setting device 119 supplies control signals $SX_1$ and $SY_1$ corresponding to the amounts of movement of the stages 12X and 12Y to the movement control units 20X and 20Y, respectively. In response to the control signals $SX_1$ and $SY_1$, the movement control units 20X and 20Y drive the stages 12X and 12Y by distances required for the step movement through the pulse motors 14X and 14Y. Consequently, the center of the observation field moves to the neighboring region designated by the operator. The step movement can be continuously performed by continuously operating the push button. In a case where the observation field has been rotated, the step movement takes place to a region which is adjacent to the rotated observation field.

Figure 12:
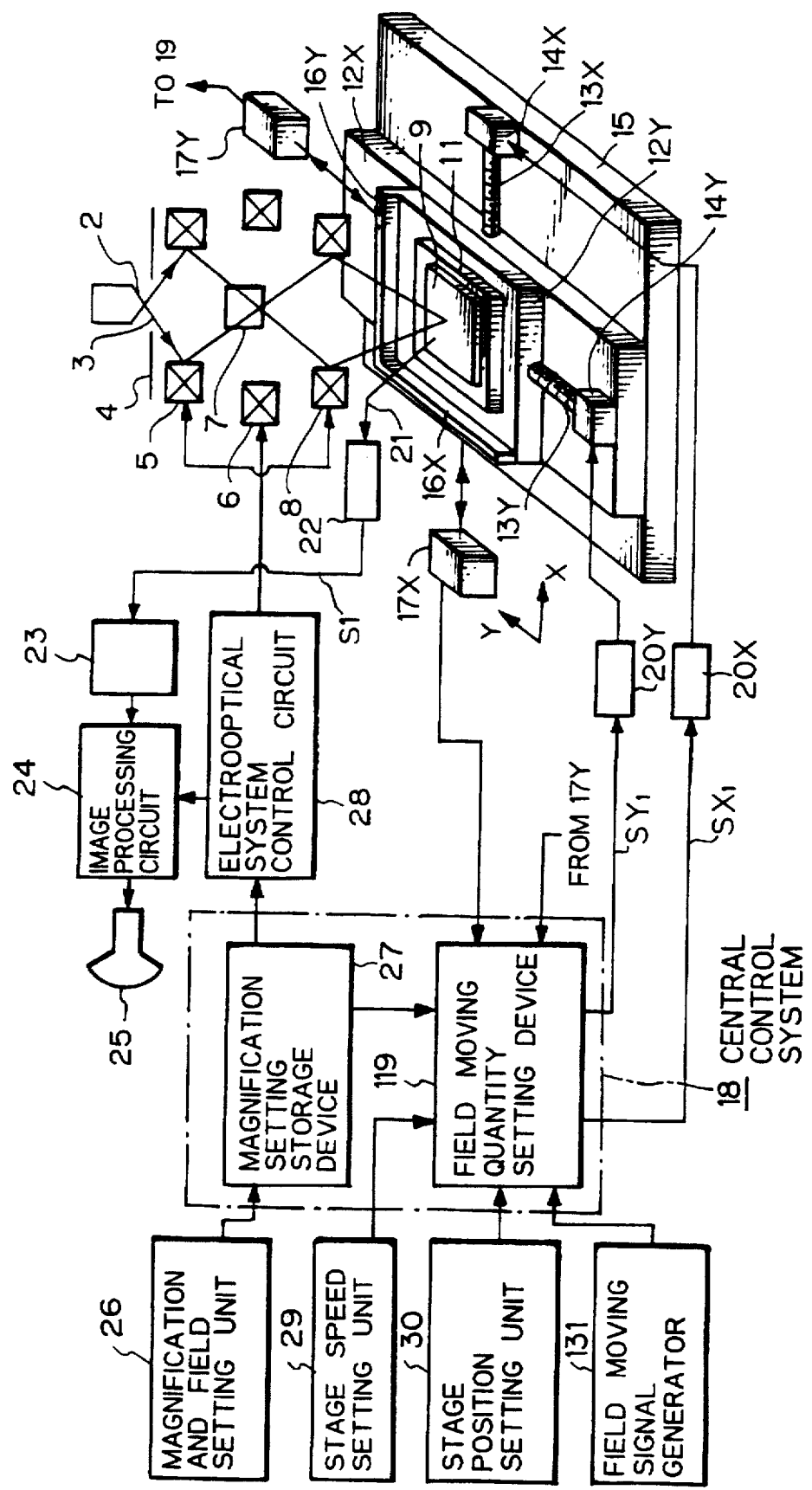
FIG. 12 is a block diagram partly containing a perspective view, showing one embodiment of the scanning electron microscope according to the present invention.

It should be noted that, since the arrangements of the remaining elements of the scanning electron microscope shown in FIG. 12 are the same as the arrangements of the corresponding elements shown in FIG. 1, description thereof is omitted. The micro-step drive control of the pulse motors 14X and 14Y in this embodiment is also basically the same as that explained in the first-described embodiment. Regarding FIGS. 3 and 4, which have been used to explain the micro-step drive control, the field moving quantity setting device 119 in this embodiment supplies the control signal $SX_1$ to the phase-by-phase switching circuit 61 and also to the control switching circuit 63. Since the feed resolution P of the stages 12X and 12Y is 0.1 μm under the same conditions as those in the first-described embodiment, the step movement of the observation field can be smoothly effected without any problem.

Next, an operation of the fifth scanning electron microscope for step movement of the observation field on the sample 9 will be described in detail.

Figure 13:
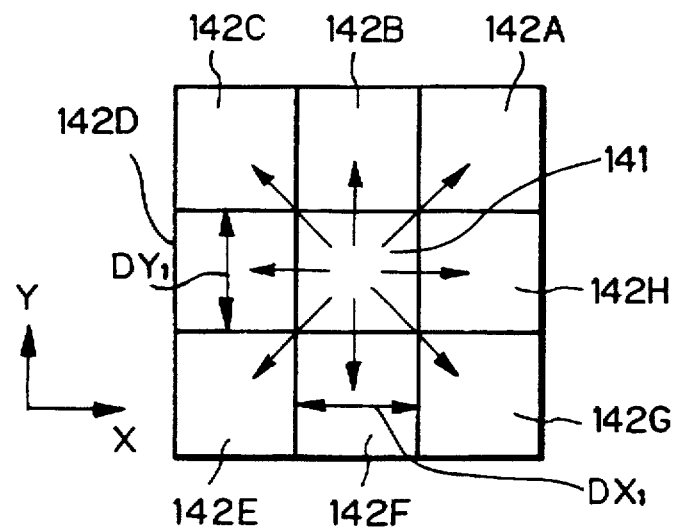
FIG. 13 shows eight regions which are adjacent to an observation field on a sample in the embodiment shown in FIG. 12.

FIG. 13 shows an observation field 141 set on the sample 9. In FIG. 13, the observation field 141 is assumed to be a rectangular region (which may be a square region) having a width $DX_1$ in the direction X and a width $DY_1$ in the direction Y. It should be noted that FIG. 13 shows a case where the rotational angle θ of the observation field is 0; when the rotational angle θ is not 0, one side of the observation field 141 is inclined at an angle θ with respect to the X-axis. In FIG. 13, there are eight regions 142A to as peripheral rectangular regions which are adjacent to the observation field 141, and which have the same size as that of the observation field 141. In this embodiment, the observation field 141 can be stepwise moved to any of the eight regions 142A to 142H. It should be noted that, when the observation field 141 is to be moved, for example, to the region 142H, which is adjacent thereto in the direction +X, the sample 9 is actually moved by the width $DX_1$ in the direction −X through the sample stage. Similarly, when the observation field 141 is to be moved, for example, to the region 142A, which lies obliquely upward of the observation field 141 on the right (as viewed in FIG. 13), the sample 9 is actually moved by the width $DX_1$ in the direction −X and by the width $DY_1$ in the direction −Y through the sample stage.

Figure 14A:
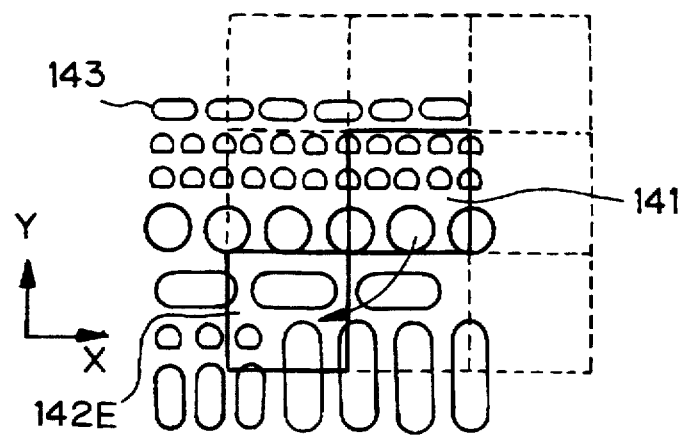
FIGS. 14(a), 14(b) and 14(c) illustrate stepwise movement of an observation field in the embodiment shown in FIG. 12.
Figure 14B:
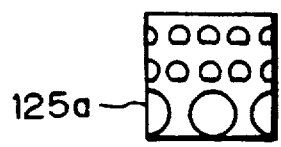

FIG. 14(a) shows the way in which the observation field 141 is set over circuit patterns 143 on the sample 9. As shown in FIG. 14(b), magnified images of patterns in the observation field 141, shown in FIG. 14(a), are displayed on the screen 125a of the CRT display 25 (see FIG. 12). To stepwise move the observation field 141 to the neighboring region 142E, which lies obliquely downward of the observation field 141 on the left, under the illustrated conditions, the operator first pushes the push button in the field moving signal generator 131 once, and then sets the moving direction of the observation field 141 to the left obliquely downward direction by using the joy stick. Thus, a signal indicating one step movement, together with a signal indicating the direction of step movement, is supplied to the field moving quantity setting device 119 in the central control system 18.

Figure 14C:
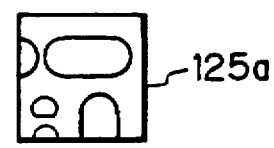

The field moving quantity setting device 119 calculates the X-direction width $DX_1$ and Y-direction width $DY_1$ of the observation field 141 set on the sample 9 on the basis of the information concerning the observation magnification and observation field from the magnification setting storage device 27. Then, the field moving quantity setting device 119 supplies control signals $SX_1$ and $SY_1$ to the movement control units 20X and 20Y for micro-step drive control so that the movement control units 20X and 20Y move the corresponding stages by the width $DX_1$ in the direction +X and by the width $DY_1$ in the direction +Y. In this embodiment, the feed resolution of the stages corresponding to the smallest step angle of the pulse motors 14X and 14Y is 0.1 μm. Assuming that the observation magnification is 100,000, and that the widths $DX_1$ and $DY_1$ of the observation field 141 are 1.8 μm, for example, each of the pulse motors 14X and 14Y should be rotated through an angle which is 18 times as large as the smallest step angle. By doing so, the sample 9, in FIG. 14(a), moves by the width $DX_1$ in the direction +X and by the width $DY_1$ in the direction +Y. Consequently, the observation field 141 moves to the region 142E, and magnified images of patterns in the region 142E are displayed on the screen 125a of the CRT display 25, as shown in FIG. 14(c).

Further, in this embodiment, if the operator designates a direction by operating the joy stick while pushing the push button in the field moving signal generator 131, step movement of the observation field is continuously carried out in the designated direction.

Further, when the lower side of the observation field 141, as viewed in FIG. 14(a), has been rotated through a rotational angle θ with respect to the X-axis, and the observation field 141 is to be stepped toward the right side thereof, the stages 12X and 12Y are simultaneously driven so that the sample 9 moves in a direction intersecting the X-axis at the angle θ. By doing so, step movement can be accurately carried out to a neighboring region even when the observation field 141 has been rotated.

Thus, according to this embodiment, the sample positioning resolution can be made more than one order in magnitude smaller than the width of the observation field of the scanning electron microscope because the pulse motors 14X and 14Y are driven by the micro-step drive control method. Accordingly, the observation field can be accurately stepped to a neighboring region, and therefore, a desired region on the sample surface can be observed at high speed and with high accuracy.

It should be noted that, although in this embodiment the pulse motors 14X and 14Y can be accurately driven by the micro-step drive control method, the drive of the stages 12X and 12Y by the feed screws 13X and 13Y involves the problems of backlash and pitch error in the feed screws 13X and 13Y. Therefore, it is desirable that backlash quantities observed when the moving direction of each stage is turned, together with pitch errors of the feed screws 13X and 13Y according to position, should be obtained in advance, and that, when the stages 12X and 12Y are to be actually driven, drive control signals should be corrected for the backlash and the pitch error.

Further, although in the above-described embodiment coordinate values (X, Y) measured by the laser interferometers 17X and 17Y are used to detect step-out of the pulse motors 14X and 14Y, the arrangement may be such that DC motors, for example, are used in place of the pulse motors 14X and 14Y, and the DC motors are driven by closed loop control on the basis of values measured by the laser interferometers 17X and 17Y. The closed loop control also makes it possible to obtain positioning resolution approximately equal to the measurement resolution of the laser interferometers. Therefore, the step movement of the observation field can be accurately carried out. However, the closed loop control requires a complicated control system, and makes it likely that stage vibration such as hunting will occur. In contrast, in a system wherein pulse motors are driven by micro-step drive control as in the case of the above-described embodiment, open loop control may be adopted, and the control system is therefore simple and stable. Further, if the pulse motor operation is stable, it becomes unnecessary to provide laser interferometers, and it is possible to use a simpler detector (e.g. an optical linear encoder) for the step-out detection.

According to the above-described fifth scanning electron microscope, the sample is moved through the sample positioning device by a distance which is equal to the width of the observation field in a direction designated through the field moving direction designating device. Accordingly, even if the observation magnification is high, the observation field can be speedily and accurately moved to a region which is adjacent to the present position on the sample.

If the sample positioning device is a stage which is driven by a feed screw system with pulse motors which are controlled by the micro-step drive control method, the sample positioning resolution can be made more than one order in magnitude smaller than the width of the observation field of the scanning electron microscope. Accordingly, the observation field can be accurately moved to a neighboring region without effecting feedback by using a high-resolution measuring device, e.g. a laser interferometer.

Further, if the observation field is a region variable in shape which is selected as desired from regions on the sample which are scanned with an electron beam, the observation field can be accurately moved to a neighboring region by the present invention, irrespective of the shape of the observation field.

Next, one embodiment of the sixth scanning electron microscope according to the present invention will be described with reference to FIG. 15. In the following description, portions of the arrangement shown in FIG. 15 in which the sixth scanning electron microscope differs from the arrangement shown in FIG. 1 will mainly be explained.

The central control system 18 in this embodiment is connected with: a magnification and field setting unit 26 which is used by the operator to set a magnification, a rotational angle of observation field, and an observation field; a field moving speed setting unit 229 for setting a moving speed (including a moving direction) of the stages 12X and 12Y; a field moving position setting unit 230 for setting a moving direction and moving distance of the stages 12X and 12Y; a field moving direction limiting unit 234 for limiting the moving direction of the observation field to a predetermined direction; a stop switch 235 for stopping the movement of the observation field; and a data input unit 31 for inputting backlash quantities of the stages 12X and 12Y and other necessary data, as will be described later.

The field moving speed setting unit 229 is an input unit having a track ball. When the operator controls the track ball, signals indicating moving speeds in the directions X and Y of the observation field on the sample 9 are supplied to the stage controller 19. The field moving direction limiting unit 234 supplies a signal for limiting the moving direction of the observation field to a predetermined direction to the stage controller 19. The stage controller 19 drives the stages 12X and 12Y through the movement control units 20X and 20Y so that the observation field is moved on the sample 9 in the designated direction and at the designated speed. Such constant-speed movement of the stages 12X and 12Y is carried out, for example, when the operator desires to move the observation field in the desired direction while observing a magnified image of the sample 9 on the CRT display 25.

Meanwhile, the field moving position setting unit 230 comprises a mouse and a keyboard. For example, the operator designates a point (move point) away from the magnified image presently displayed on the CRT display 25 by a mouse operation. Information concerning the move point, together with information concerning the present observation magnification and observation field from the magnification setting storage device 27, is supplied to the stage controller 19. The stage controller 19 calculates a direction and distance from the center of the present observation field to the move point. Then, the stage controller 19 moves the stages 12X and 12Y by the calculated distance in the calculated direction through the movement control units 20X and 20Y. Thus, the center of the observation field moves to the position designated by the operator.

Next, the arrangements of the field moving speed setting unit 229, the field moving direction limiting unit 234 and the stop switch 235 in this embodiment will be explained in detail with reference to FIG. 16.

Figure 16:
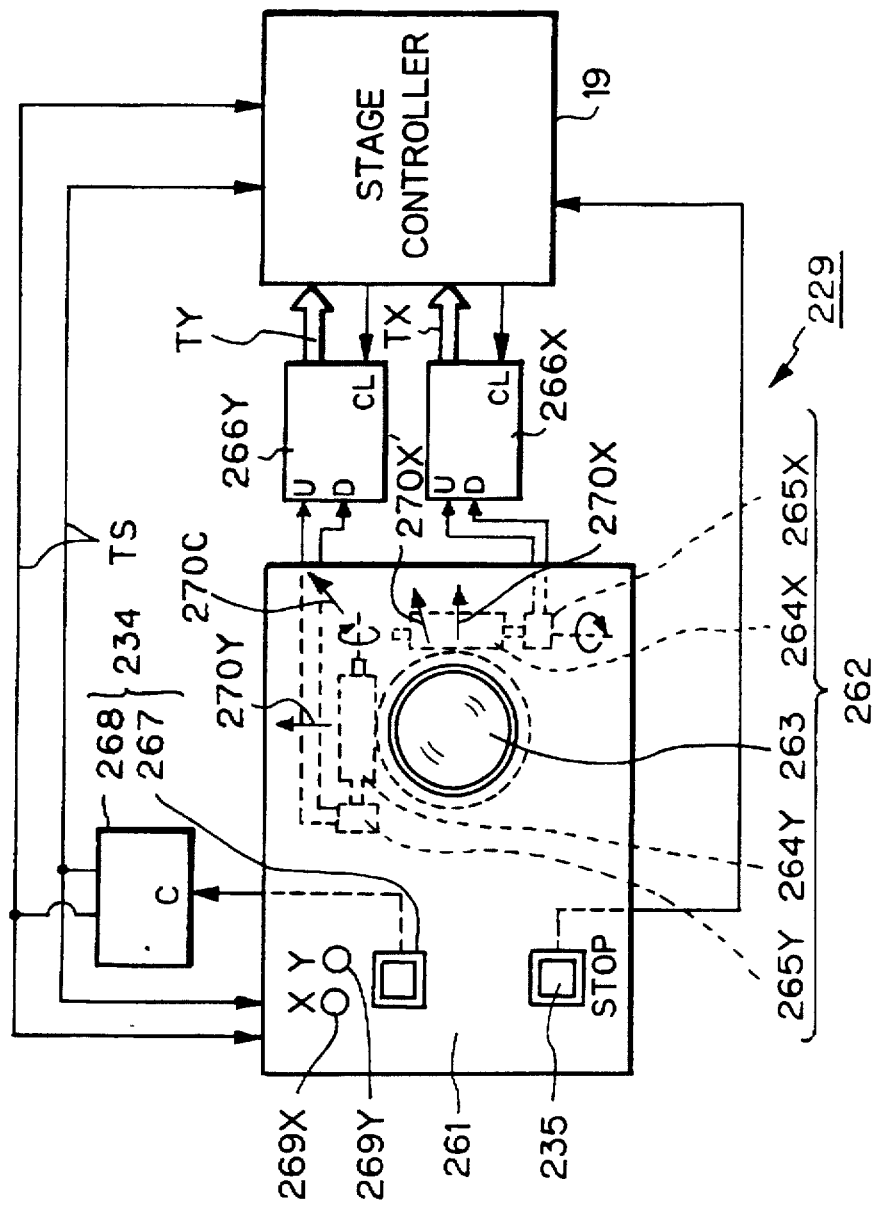
FIG. 16 shows the arrangements of a field moving direction limiting unit, a track ball, etc. in the embodiment shown in FIG. 15.

FIG. 16 shows an essential part of an operator console 261 in this embodiment. Referring to FIG. 16, a rotating member 263 is buried in an opening provided in the surface of the operator console 261. Inside the operator console 261, a rotating shaft 264X is placed in sliding contact with the right-hand surface of the rotating member 263, while a rotating shaft 264Y is placed in sliding contact with the upper surface of the rotating member 263, and rotary encoders 265X and 265Y are connected to the rotating shafts 264X and 264Y, respectively. The rotating member 263, the rotating shafts 264X and 264Y, and the rotary encoders 265X and 265Y constitute in combination a track ball 262. By rotating the rotating member 263 in a rightward direction (or reverse direction), which is indicated by the arrow 270X, an up-down pulse signal indicating a rotational direction is outputted from the rotary encoder 265X, and the pulse signal is supplied to a counting pulse input terminal of a reversible counter 266X. Similarly, by rotating the rotating member 263 in an upward direction (or reverse direction), which is indicated by the arrow 270Y, an up-down pulse signal is outputted from the rotary encoder 265Y, and the pulse signal is supplied to a counting pulse input terminal of a reversible counter 266Y. If the rotating member 263 is rotated in an oblique direction indicated by the arrow 270C, pulse signals are simultaneously supplied to the two reversible counters 266X and 266Y.

The reversible counters 266X and 266Y totalize the supplied pulse signals with plus and minus signs to obtain count values TX and TY, respectively, and supply them to the stage controller 19. The count value TX corresponds to the rotational angle of the rotating member 263 in the rightward direction (leftward direction in the case of a negative value), and the count value TY corresponds to the rotational angle of the rotating member 263 in the upward direction (downward direction in the case of a negative value). The stage controller 19 can recognize the twodimensional rotational angle of the rotating member 263 of the track ball 262 by the count values TX and TY. Further, the stage controller 19 can reset the count values TX and TY to 0 at any time through respective clear terminals of the reversible counters 266X and 266Y. The track ball 262 and the reversible counters 266X and 266Y constitute in combination the field moving speed setting unit 229.

In a case where there is no limitation on the moving direction by the field moving direction limiting unit 234, described later, and the observation field remains unrotated, the stage controller 19 drives the X- and Y-stages 12X and 12Y, shown in FIG. 1, through the movement control units 20X and 20Y at respective moving speeds which are determined by $k(\beta).TX$ and $k(\beta).TY$ using a constant $k(\beta)$ previously determined in accordance with the observation magnification $\beta$, and the count values TX and TY. Accordingly, the observation field on the sample 9 is moved by a mechanical field moving method at a moving speed determined according to the rotational direction and angle of the rotating member 263 of the track ball 262.

In addition, the stop switch 235 is fixed to the surface of the operator console 261. When the stop switch 235 is actuated, one pulse signal is supplied to the stage controller 19. In response to the pulse signal, the stage controller 19 resets the count values of the reversible counters 266X and 266Y to 0. For example, in a case where the operator desires to stop the observation field on the sample 9 after moving it in the desired direction at the desired speed by rotating the rotating member 263 of the track ball 262, the observation field can be stopped by returning the rotating member 263 to the previous rotational position to thereby return the count values TX and TY to 0. However, it is difficult to completely return the rotating member 263 to the previous rotational position. Therefore, to stop the observation field, the operator is recommended to remove his/her hand from the rotating member 263 of the track ball 262 and to actuate the stop switch 235. By doing so, a pulse signal is supplied to the stage controller 19, and the stage controller 19 resets the count values TX and TY of the reversible counters 266X and 266Y to 0. Consequently, the moving speed command value becomes 0, and the observation field stops. Thereafter, when the rotating member 263 is rotated again, the observation field moves at a speed corresponding to the angle through which the rotating member 263 is rotated from the rotational position at which it has been stopped.

The field moving direction limiting unit 234 is attached to the surface of the operator console 261. The field moving direction limiting unit 234 comprises a switch 267 which generates one pulse signal each time it is actuated, and a ternary counter 268 which totalizes pulse signals generated from the switch 267 to obtain a 2-bit count value TS. The count value TS is supplied to the stage controller 19. When the power supply is turned on, the count value TS of the counter 268 is 0. Thereafter, each time the switch 267 is actuated, the count value TS of the counter 268 cyclically changes in the sequence: 1, 2, 0, and 1 in decimal. The relationship between the count value TS and the moving direction of the observation field has previously been determined such that, when the count value TS is 0, the moving direction of the observation field is an arbitrary direction on a two-dimensional plane, whereas, when the count value TS is 1 or 2, the moving direction of the observation field is a direction X or Y. The directions X and Y in this case are usually directions which are parallel to the directions X and Y in FIG. 15. However, in a case where the observation field on the sample 9 is rotated by changing the electron beam scanning direction, for example, directions which are defined by rotating the directions X and Y in FIG. 15 through the rotational angle of the observation field are newly regarded as directions X' and Y', and if the rotating member 263 of the track ball 262 is rotated rightwardly, for example, the observation field can be moved in the direction X'.

Accordingly, in a case where the observation field remains unrotated, when the count value TS is 1 (i.e. the moving direction is limited to the direction X), the stage controller 19 regards the count value TY of the reversible counter 266Y as 0, whereas, when the count value TS is 2 (i.e. the moving direction is limited to the direction Y), the count value TX of the reversible counter 266X is regarded as 0. When the count value TS is 0, the stage controller 19 regards both the two count values TX and TY as effective. Under these conditions, the stage controller 19 controls the moving speed of the stages 12X and 12Y. Thus, when the moving direction is limited to the direction X, even if the rotating member 263 of the track ball 262 is rotated in an arbitrary direction, only the rightward (or leftward) rotational component of the rotational angle is regarded as effective, and the observation field moves in the direction X at a moving speed corresponding to the rotational component.

When the moving direction is limited to the direction Y, even if the rotating member 263 of the track ball 262 is rotated in an arbitrary direction, only the upward (or downward) rotational component of the rotational angle is regarded as effective, and the observation field moves in the direction Y at a moving speed corresponding to the rotational component. When the observation field has been rotated, the count values TX and TY of the reversible counters 266X and 266Y are associated with the new directions X' and Y' on the rotated coordinate axes.

Further, the 2-bit signal indicating the count value TS of the ternary counter 268 is supplied to a driver circuit for light-emitting devices 269X and 269Y which are fixed to the surface of the operator console 261. When the count value TS is 1 (i.e. when the moving direction of the observation field is the direction X), the light-emitting device 269X turns on, whereas, when the count value TS is 2 (i.e. when the moving direction of the observation field is the direction Y), the light-emitting device 269Y turns on. When the moving direction of the observation field is an arbitrary direction (i.e. a two-dimensional direction), both the light-emitting devices 269X and 269Y are off. Accordingly, the operator can recognize the movable direction of the observation field, which is presently limited through the field moving direction limiting unit 234, from the lighting conditions of the light-emitting devices 269X and 269Y.

In this embodiment, the movement control units 20X and 20Y control the pulse motors 14X and 14Y, respectively, by the micro-step drive control method in the same way as in the foregoing embodiments.

It should be noted that the feed resolution p of the stages 12X and 12Y is 0.1 μm under the same conditions as those in the embodiment which has been described with regard to the first to fourth scanning electron microscopes. Therefore, the observation field can be smoothly moved.

Further, in this embodiment, DC motors may be used in place of the pulse motors 14X and 14Y so as to constitute a closed loop together with the laser interferometers 17X and 17Y, thereby driving the sample holder 11 at moving steps close to the measurement resolution of the laser interferometers.

Figure 15:
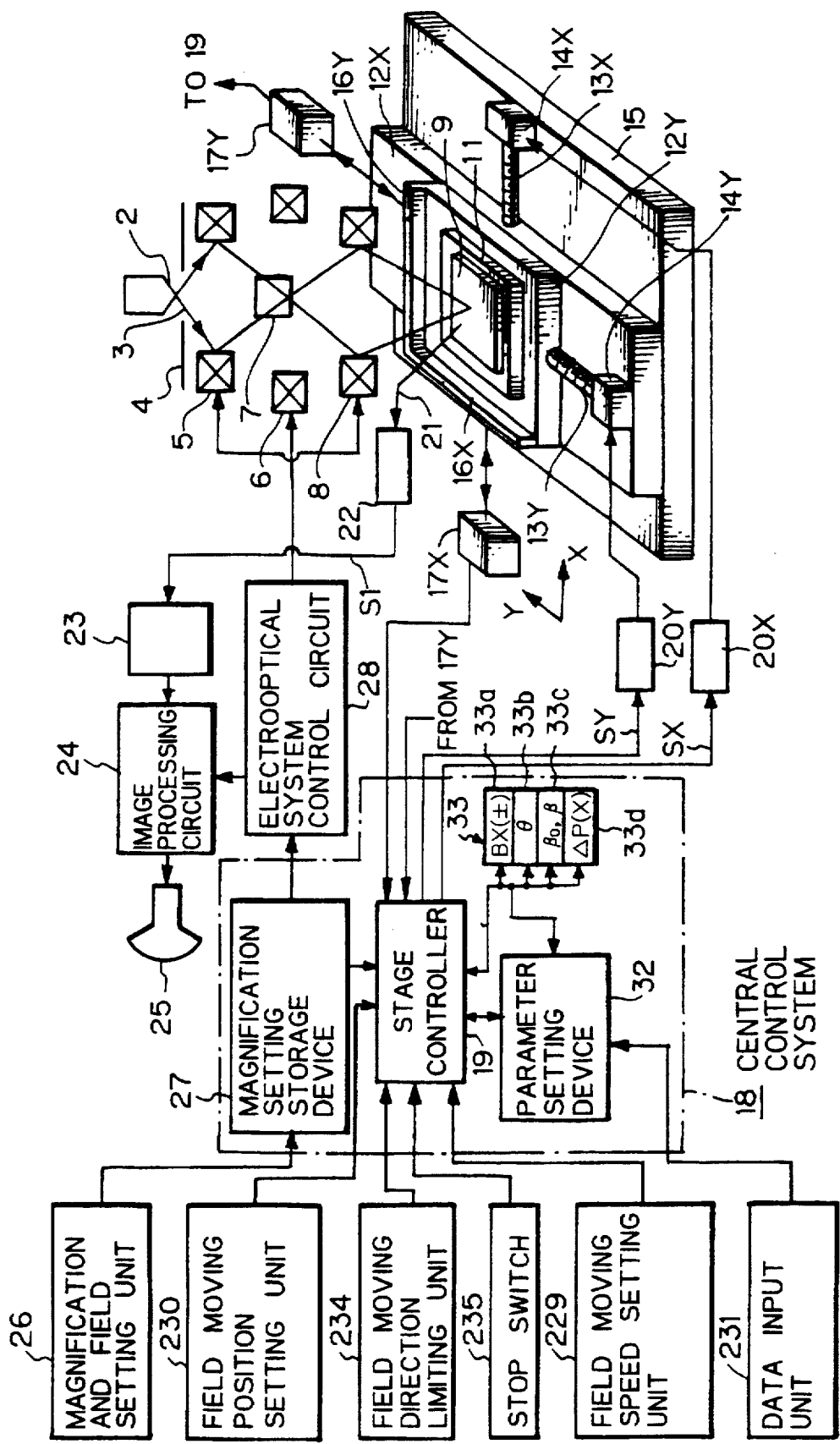
FIG. 15 is a block diagram partly containing a perspective view, showing one embodiment of the scanning electron microscope according to the present invention.

It should be noted that among the constituent elements shown in FIG. 15, those which have not been described above are similar to the corresponding constituent elements in FIG. 1. Therefore, description thereof is omitted.

Next, one example of an operation performed in this embodiment when the observation field set on the sample 9 is to be moved will be explained with reference to FIGS. 15 to 20. First, the sample 9 is placed on the sample holder 11 in FIG. 15, and an observation image of the sample 9 is displayed on the CRT display 25.

Figure 17A:
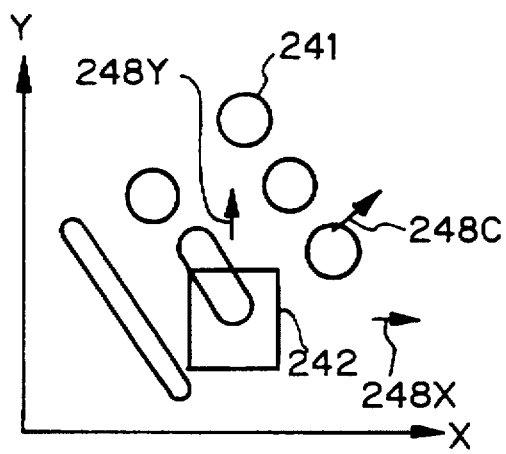
FIGS. 17(a) and 17(b) show an observation field on a sample, and an observation image thereof.
Figure 17B:

FIG. 17(a) shows an observation field 242 set on the sample 9 at that time. As shown in FIG. 17(a), a rectangular observation field 242 is set over patterns 241 on the sample 9. FIG. 17(b) shows a display screen 225a of the CRT display 25, which is shown in FIG. 15. A magnified image of a pattern in the observation field 242 is displayed on the display screen 225a. Accordingly, assuming that the magnification is β, the actual size of the observation field 242, shown in FIG. 17(a), is 1/β of the size of the display screen 225a, shown in FIG. 17(b).

It is assumed that under the above-described conditions, both the light-emitting devices 269X and 269Y, shown in FIG. 16, are off, and thus the moving direction of the observation field is an arbitrary direction. When it is desired to move the observation field 242 approximately in a right obliquely upward direction indicated by the arrow 248C in FIG. 17(a), the operator rotates the rotating member 263 of the track ball 262, shown in FIG. 16, in a right obliquely upward direction indicated by the arrow 270C. Consequently, the observation field 242 moves in the right obliquely upward direction at a speed corresponding to the rotational angle of the rotating member 263. When it is desired to change the speed of movement (the absolute value of the moving speed) of the observation field 242 in that direction, the operator should control the rotational angle of the rotating member 263. When it is desired to stop the observation field 242 at a desired position, the operator should remove his/her hand from the rotating member 263 and actuate the stop switch 235.

On the other hand, when it is desired to move the observation field 242 precisely in the direction +X as shown by the arrow 248X in FIG. 17(a), the operator first actuates the switch 267 of the field moving direction limiting unit 234, shown in FIG. 16, to turn on only the light-emitting device 269X, thereby limiting the moving direction of the observation field to the direction X. Once the moving direction has been limited to the direction X, even if the operator rotates the rotating member 263 in a direction slightly deviating from the rightward direction, as shown by the arrow 270X', since the stage controller 19 regards only the count value TX as effective. Accordingly, the observation field 242 accurately moves in the direction +X at a speed approximately corresponding to the rotational angle of the rotating member 263. Similarly, when it is desired to move the observation field 242 precisely in the direction +Y, as shown by the arrow 248Y, the operator actuates the switch 267, shown in FIG. 16, to turn on only the light-emitting device 269Y, thereby limiting the moving direction to the direction Y, and then rotates the rotating member 263 of the track ball 262 approximately upwardly.

Thus, according to this embodiment, the moving direction of the observation field 242 can be limited with the field moving direction limiting unit 234 when the operator desires to move the observation field 242 precisely in the direction X or Y. Therefore, it is unnecessary to rotate the rotating member 263 of the track ball 262 precisely in the direction corresponding to the direction X or Y.

Figure 18A:
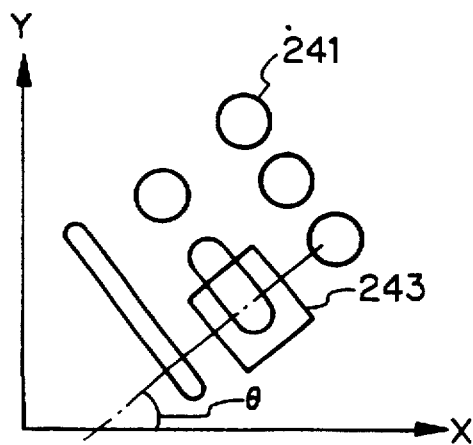
FIGS. 18(a) and 18(b) show a rotated observation field, and an observation image thereof.
Figure 18B:
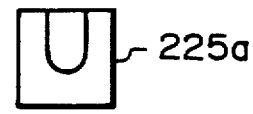

Next, an operation performed when the observation field is to be electrically rotated will be explained. In this case, the operator rotates the observation field 242 on the sample through an angle θ (θ is herein assumed to be 45°) counterclockwise from the X-axis through the image magnification and field setting unit 26, shown in FIG. 15. As a result, the electron beam scanning direction on the sample 9 is rotated through 45° by the action of the magnification setting storage device 27, and as shown in FIG. 18(a), a rectangular observation field 243 is set over the patterns 241 on the sample 9 in parallel to a direction which is counterclockwise inclined at 45° with respect to the direction X. Further, the angle θ is stored into the rotational angle storage region 33b in the memory 33 through the stage controller 19, shown in FIG. 15. Thus, a magnified image of a pattern in the observation field 243 is displayed on the display screen 225a, as shown in FIG. 18(b). The magnified image is displayed in such a manner that each side of the rectangular observation field 243 is parallel or perpendicular to the sides of the display screen 225a.

Next, when it is desired to observe a region which lies precisely rightward of the right-hand side of the magnified image displayed on the display screen 225a in FIG. 18(b), the operator first limits the moving direction to the direction X with the field moving direction limiting unit 234, shown in FIG. 16, and then rotates the rotating member 263 of the track ball 262 approximately rightwardly. Consequently, the stage controller 19 regards only the count value TX corresponding to the moving speed in the direction X as effective. The stage controller 19 reads out the angle θ from the rotational angle storage region 33b in the memory 33, and causes the stages 12X and 12Y to move in a direction rotated through the angle (180°−θ) clockwise with respect to the direction +X at a speed corresponding to the count value TX. This movement of the stages 12X and 12Y can be realized, for example, by moving the Y-stage 12Y by ΔX·tan θ in the direction −Y while moving the X-stage 12X by ΔX in the direction −X.

Figure 19A:
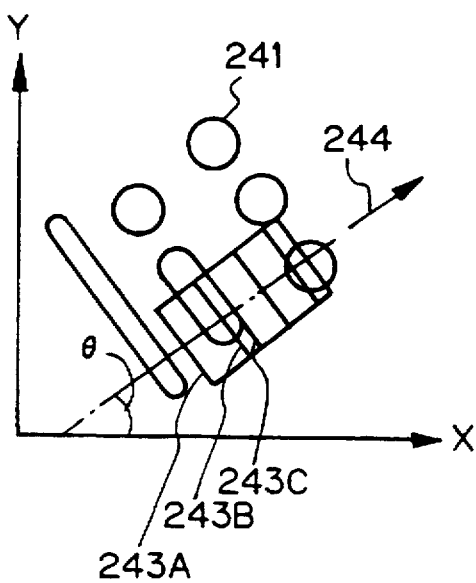
FIGS. 19(a), 19(b), 19(c) and 19(d) illustrate an operation performed when a rotated observation field is horizontally moved.
Figures 19B, 19C:
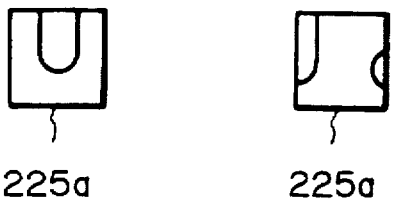
Figure 19D:
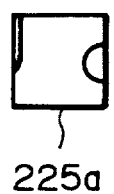

Consequently, as shown in FIG. 19(a), the observation field moves over the patterns 241 on the sample 9 from a region 243A through a region 243B to a region 243C . . . along a direction 244 which is counterclockwise tilted precisely at an angle θ with respect to the direction +X. As the observation field successively moves through the regions 243A, 243B and 243C, magnified images such as those shown in FIGS. 19(b), 19(c) and 19(d) are successively displayed on the display screen 225a of the CRT display 25. Accordingly, this embodiment enables the observation field to be moved in a set direction on the basis of the magnified image displayed on the display screen 225a by a mechanical field moving method independently of the amount of rotation of the observation field even when it is electrically rotated.

Figure 20:
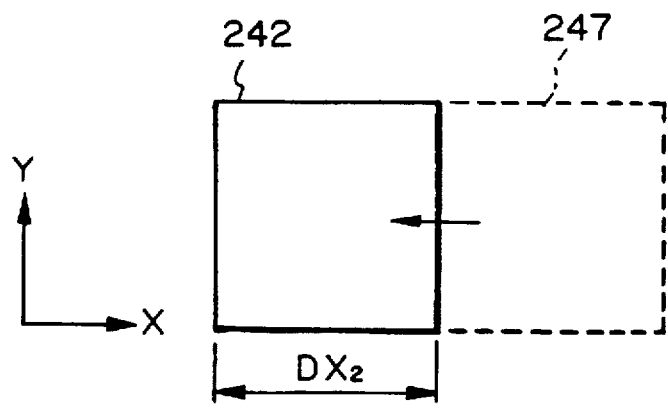
FIG. 20 illustrates the way in which an observation field is moved at a constant speed on a display screen.

The following is a description of one example of an operation performed in this embodiment when the observation field is to be moved after the observation magnification has been changed. At this time, the operator determines a speed at which the sample observation image is to be moved within the effective field range in the display screen of the CRT display 25, for example, through the data input unit 231, shown in FIG. 15. For example, a moving speed is set so that the sample observation image will move across the effective field range in a time period T (T is 3 seconds, for example, in this embodiment). Assuming that the observation field on the sample 9 is an observation field 242 having a width $DX_2$ in the direction X, as shown in FIG. 20, and that the observation field 242 is to be moved toward a region 247 which is adjacent to the present position in the direction +X in a time period T, the moving speed of the X-stage 12X is set at a speed $DX_2/T$ in the direction −X. The observation magnification at this time is assumed to be $\beta_0$ ($\beta_0$ is 10,000, for example). The observation magnification $\beta_0$ has been stored in a magnification storage region 33c, which is provided in the memory 33.

The rotational angle of the rotating member 263 of the track ball 262 (shown in FIG. 16) which is required to obtain the stage moving speed $DX_2/T$ has previously been set to a predetermined angle (hereinafter referred to as "reference rotational angle") through which the rotating member 263 can be readily rotated in a single operation by the operator. Accordingly, if the operator rotates the rotating member 263 rightwardly through an angle approximately equal to the reference rotational angle, the observation field 242 moves at such a speed that it crosses the effective field range of the display screen 225a approximately in the time period T.

Next, if the operator changes the observation magnification to β (β is 20,000, for example) through the magnification and field setting unit 26, the observation magnification β after the magnification change is stored into the magnification storage region 33c in the memory 33. The magnification storage region 33c has also been stored with the previous observation magnification $\beta_0$. Thereafter, if the operator rotates the rotating member 263 of the track ball 262, shown in FIG. 16, rightwardly through an angle approximately equal to the reference rotational angle after limiting the moving direction to the direction X, the stage controller 19 drives the X-stage 12X so that the moving speed of the image displayed on the display screen 225a of the CRT display 25 is equal to the image moving speed at the previous observation magnification.

More specifically, assuming that the observation field 242 is to be moved in the direction +X in FIG. 20, the stage controller 19 drives the X-stage 12X in the direction −X at a speed V(β) which is determined by the above-described Eq. (2)

Consequently, the sample observation image moves across the effective field range on the display screen of the CRT display 25 approximately in the time period T. Accordingly, in this embodiment, when the rotational angle of the rotating member 263 of the track ball 262 is the same, the magnified image of the sample moves at a constant speed on the display screen independently of the observation magnification, and thus the controllability improves.

Although in the above-described embodiment the track ball 262 is used as the field moving speed setting unit 229, an input device such as a joy stick may also be used in place of the track ball 262.

As has been described above, the sixth scanning electron microscope is provided with the moving direction limiting device, which enables the moving direction of the sample stage to be set in a first direction, a second direction, or an arbitrary direction. Therefore, the observation field can be accurately moved, for example, in a direction parallel to the first direction simply by inputting a moving direction approximately coincident with the first direction with the moving direction input device after limiting the moving direction of the sample stage to the first direction.

Further, in a case where the moving direction input device sets a two-dimensional moving speed of the sample stage in the first and second directions, and the stage controller drives the sample stage at the speed component in the direction limited by the moving direction limiting device within the moving speed set through the moving direction input device, the observation field can be accurately moved at the designated moving speed in the direction limited through the moving direction limiting device simply by approximately inputting a moving direction and a moving speed with the moving direction input device.

When the moving direction input device is a track ball, it is particularly difficult to rotate the rotating member of the track ball precisely in a direction corresponding to a predetermined moving direction. Therefore, by using such a moving direction input device in combination with the moving direction limiting device as in the present invention, it is possible to satisfy both the demanded controllability and accuracy.

Next, one embodiment of the seventh scanning electron microscope according to the present invention will be described with reference to FIG. 21. In the following description, portions of the arrangement shown in FIG. 21 in which the seventh scanning electron microscope differs from the arrangement shown in FIG. 1 will mainly be explained.

The central control system 18 in this embodiment is connected with: a magnification and field setting unit 326 which is used by the operator to set a magnification, a rotational angle of observation field, and an observation field; a field movement information setting unit 329 for setting a moving speed of the stages 12X and 12Y, or information concerning the move position (movement information); a position mode/speed mode selecting switch 336 which is used by the operator to select either a position mode or a speed mode and designate the selected mode to the stage controller 19; a field moving direction limiting unit 334 for limiting the moving direction of the observation field to a predetermined direction; a stop switch 335 for stopping the movement of the observation field; and a data input unit 31 for inputting backlash quantities in the stages 12X and 12Y.

The field movement information setting unit 329 is an input device having a track ball. When the operator controls the track ball, movement information concerning the observation field on the sample 9 is supplied to the stage controller 19. When the position mode is selected through the position mode/speed mode selecting switch 336, the stage controller 19 regards the movement information as information concerning the direction and distance to a position to which the observation field should move, whereas, when the speed mode is selected through the position mode/speed mode selecting switch 336, the stage controller 19 regards the movement information as information concerning the moving speed (including the moving direction) of the observation field.

When the speed mode is selected, the field moving direction limiting unit 334 supplies the stage controller 19 with a signal for limiting the moving direction of the observation field to a predetermined direction. The stage controller 19 drives the stages 12X and 12Y through the movement control units 20X and 20Y to move the observation field on the sample 9 in the designated direction at the set speed. Such a stage movement is effected, for example, in a case where the operator desires to move the observation field in the desired direction when observing a magnified image of the sample displayed on the CRT display 25.

Further, in this embodiment, the operator can designate a position to which the observation field is desired to move through a keyboard (not shown). For example, if the operator inputs a command from the keyboard so that the stages 12X and 12Y will move by 10 mm in the direction X, the stage controller 19 rotates the pulse motor 14X through a rotational angle corresponding to 10 mm through the movement control unit 20X in response to the input command.

Next, the arrangements of the field movement information setting unit 329, the field moving direction limiting unit 334, the stop switch 335 and the position mode/speed mode selecting switch 336 in this embodiment will be explained in detail with reference to FIG. 22.

Figure 22:
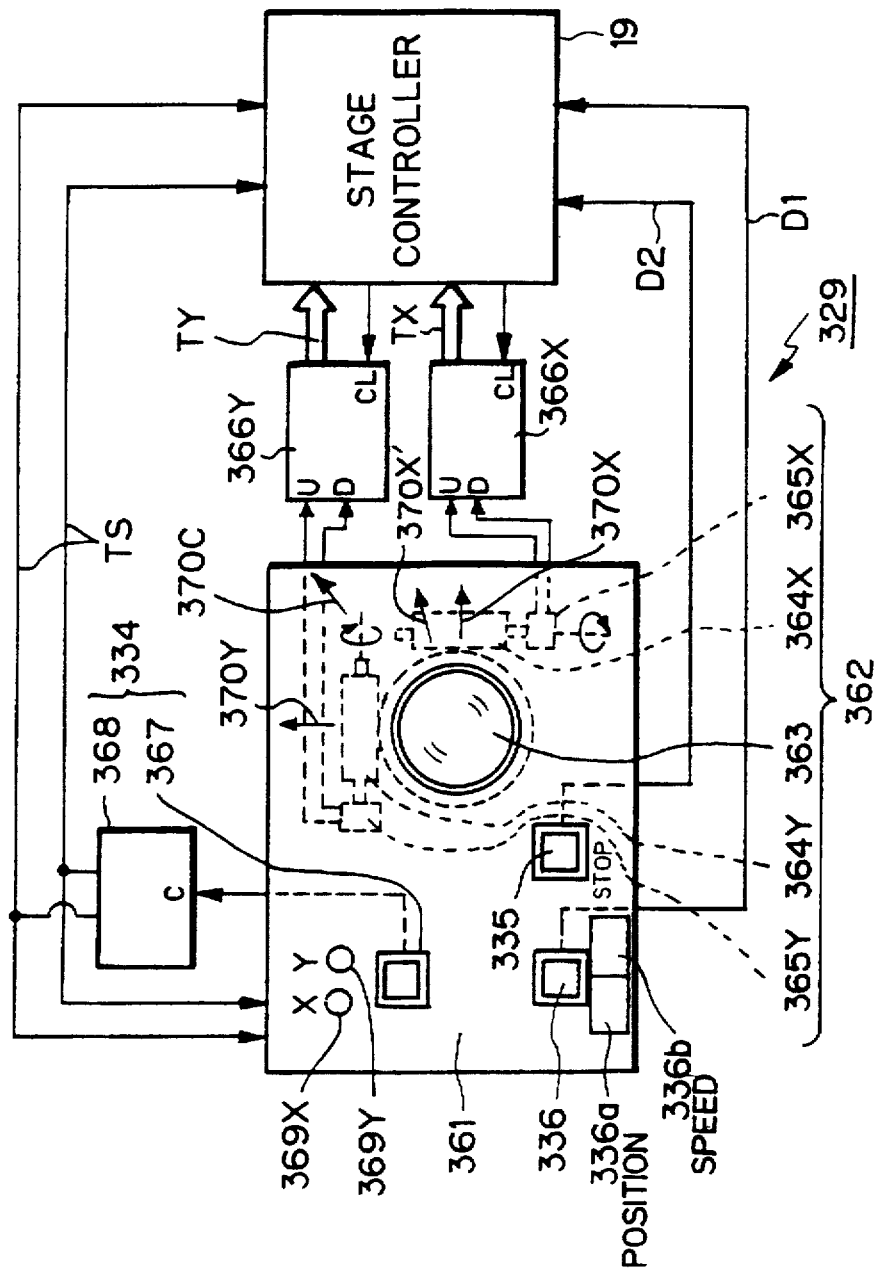
FIG. 22 shows the arrangements of a position mode/speed mode selecting switch, a track ball, etc. in the embodiment shown in FIG. 21.

FIG. 22 shows an essential part of an operator console 361 in this embodiment. Referring to FIG. 22, the position mode/speed mode selecting switch 336 is fixed to the surface of the operator console 361. A discrimination signal D1 is supplied from the switch 336 to the stage controller 19. The discrimination signal D1 is at a high level "1" when the operator keeps his/her hand off the switch 336. When the operator pushes the switch 336, the discrimination signal D1 changes to a low level "0". When the discrimination signal D1 is at the high level "1", the stage controller 19 recognizes that the position mode has been selected, whereas, when the discrimination signal D1 is at the low level "0", the stage controller 19 recognizes that the speed mode has been selected. Further, when the discrimination signal D1 is at the high level "1", an indicating element 336a for indicating the position mode, which is annexed to the position mode/speed mode selecting switch 336, turns on. When the discrimination signal D1 is at the low level "0", an indicating element 336b for indicating the speed mode, which is also annexed to the switch 336, turns on. Thus, the operator can confirm the mode that is presently selected.

A rotating member 363 is buried in an opening provided in the surface of the operator console 361. Inside the operator console 361, a rotating shaft 364X is placed in sliding contact with the right-hand surface of the rotating member 363, while a rotating shaft 364Y is placed in sliding contact with the upper surface of the rotating member 363, and rotary encoders 365X and 365Y are connected to the rotating shafts 364X and 364Y, respectively. The rotating member 363, the rotating shafts 364X and 364Y, and the rotary encoders 365X and 365Y constitute in combination a track ball 362. By rotating the rotating member 363 in a rightward direction (or reverse direction), which is indicated by the arrow 370X, an up-down pulse signal indicating a rotational direction is outputted from the rotary encoder 365X, and the pulse signal is supplied to a counting pulse input terminal of a reversible counter 366X. Similarly, by rotating the rotating member 363 in an upward direction (or reverse direction), which is indicated by the arrow 370Y, an up-down pulse signal is outputted from the rotary encoder 365Y, and the pulse signal is supplied to a counting pulse input terminal of a reversible counter 366Y. If the rotating member 363 is rotated in an oblique direction indicated by the arrow 370C, pulse signals are simultaneously supplied to the two reversible counters 366X and 366Y.

The reversible counters 366X and 366Y totalize the supplied pulse signals with plus and minus signs to obtain count values TX and TY, respectively, and supply them to the stage controller 19. The count value TX corresponds to the rotational angle of the rotating member 363 in the rightward direction (leftward direction in the case of a negative value), and the count value TY corresponds to the rotational angle of the rotating member 363 in the upward direction (downward direction in the case of a negative value). The stage controller 19 can reset the count values TX and TY to 0 at any time through respective clear terminals of the reversible counters 366X and 366Y. The track ball 362 and the reversible counters 366X and 366Y constitute in combination the field movement information setting unit 329.

In this embodiment, assuming that the position mode has been set, and that there is no limitation on the moving direction by the field moving direction limiting unit 334 (described later), and the observation field remains unrotated, the stage controller 19 regards the supplied count values TX and TY as information indicating amounts of displacement in the directions X and Y to a position where the observation field should be set. More specifically, the stage controller 19 drives the X- and Y-stages 12X and 12Y, shown in FIG. 21, through the movement control units 20X and 20Y by distances which are determined by $q(\beta)\cdot TX$ and $q(\beta)\cdot TY$ using a constant $q(\beta)$, which has previously been determined in accordance with the observation magnification $\beta$, and the count values TX and TY. Accordingly, the observation field on the sample 9 is moved by the mechanical field moving method by a distance corresponding to the rotational angle of the rotating member 363 of the track ball 362 with respect to the rotational direction of the rotating member 363.

Figure 27:
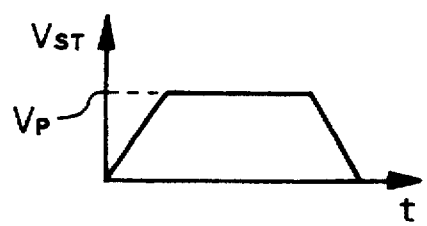
FIG. 27 shows a characteristic curve showing the change in absolute value of the moving speed of a sample stage when an observation field is moved in a position mode.

FIG. 27 shows a characteristic curve showing the change in absolute value of the moving speed $V_{ST}$ of the stages 12X and 12Y when the observation field is moved in the position mode as described above. As shown in FIG. 27, the absolute value of the moving speed $V_{ST}$ changes in the shape of a trapezoid whose upper side is defined by a predetermined constant peak speed $V_P$. However, the peak speed $V_P$ may be changed so as to be approximately proportional to the distance through which the observation field moves. By doing so, the traveling time becomes approximately constant.

Referring to FIG. 22, when the speed mode has been set, the stage controller 19 regards the count values TX and TY as information indicating speeds of movement of the observation field in the directions X and Y. In a case where there is no limitation on the moving direction through the field moving direction limiting unit 334 (described alter), and the observation field remains unrotated, the stage controller 19 drives the X- and Y-stages 12X and 12Y, shown in FIG. 21, through the movement control units 20X and 20Y at moving speeds which are determined by $k(\beta)\cdot TX$ and $k(\beta)\cdot TY$ using a constant $k(\beta)$, which has previously been determined in accordance with the observation magnification $\beta$, and the count values TX and TY. Accordingly, the observation field on the sample 9 is moved by the mechanical field moving method at a moving speed corresponding to the rotational direction and angle of the rotating member 363 of the track ball 362.

Further, the stop switch 335 is fixed to the surface of the operator console 361. When the stop switch 335 is actuated, a pulse signal D2 which is at a high level "1" only for a predetermined period of time is supplied to the stage controller 19. In response to the pulse signal D2, the stage controller 19 resets the count values of the reversible counters 366X and 336Y to 0. For example, in a case where the operator desires to stop the observation field after moving it on the sample 9 in a desired direction at a desired speed by rotating the rotating member 363 of the track ball 362 when the speed mode has been selected, the observation field can be stopped by returning the rotating member 363 to the previous rotational position to thereby reset the count values TX and TY of the reversible counters 366X and 366Y to 0. However, it is difficult to completely return the rotating member 363 to the previous rotational position. Therefore, to stop the observation field, the operator is recommended to remove his/her hand from the rotating member 363 of the track ball 362 and to actuate the stop switch 335. By doing so, the pulse signal D2, which is supplied to the stage controller 19, changes to the high level "1", and the stage controller 19 resets the count values TX and TY of the reversible counters 366X and 366Y to 0. Consequently, the moving speed command value becomes 0, and the observation field stops. Thereafter, when the rotating member 363 is rotated again, the observation field moves at a speed corresponding to the angle through which the rotating member 363 is rotated from the rotational position at which it has been stopped.

The field moving direction limiting unit 334 has a switch 367 and a counter 368. The switch 367 and the counter 368 have the same arrangements and functions as those of the field moving direction limiting unit 234 in the above-described sixth scanning electron microscope.

Accordingly, when the observation field remains unrotated, and the count value TS is 1 (i.e. when the moving direction is limited to the direction X), the stage controller 19 regards the count value TY of the reversible counter 366Y as 0. When the count value TS is 2 (i.e., when the moving direction is limited to the direction Y), the stage controller 19 regards the count value TX of the reversible counter 366X as 0. When the count value TS is 0, the stage controller 19 regards both the two count values TX and TY as effective. Under these conditions, the stage controller 19 controls the moving distance or the moving speed of the stages 12X and 12Y. Thus, when the moving direction is limited to the direction X, even if the rotating member 363 of the track ball 362 is rotated in an arbitrary direction, only the rightward (or leftward) rotational component of the rotational angle is regarded as effective, and the observation field moves in the direction X by a distance corresponding to the rotational component or at a moving speed corresponding to it.

When the moving direction is limited to the direction Y, even if the rotating member 363 of the track ball 362 is rotated in an arbitrary direction, only the upward (or downward) rotational component of the rotational angle is regarded as effective, and the observation field moves in the direction Y by a distance corresponding to the rotational component or at a moving speed corresponding to it. When the observation field has been rotated, the count values TX and TY of the reversible counters 366X and 366Y are associated with the new directions X' and Y' on the rotated coordinate axes.

The on/off operation of the light-emitting devices 369X and 369Y is also the same as that of the light-emitting devices 269X and 269Y in the above-described sixth scanning electron microscope.

In this embodiment, the movement control units 20X and 20Y control the pulse motors 14X and 14Y, respectively, by the micro-step drive control method in the same way as in the foregoing embodiments.

It should be noted that the feed resolution p of the stages 12X and 12Y is 0.1 μm under the same conditions as those in the embodiment which has been described with regard to the first to fourth scanning electron microscopes. Therefore, the observation field can be smoothly moved.

Further, in this embodiment, DC motors may be used in place of the pulse motors 14X and 14Y so as to constitute a closed loop together with the laser interferometers 17X and 17Y, thereby driving the sample holder 11 at moving steps close to the measurement resolution of the laser interferometers.

Figure 21:
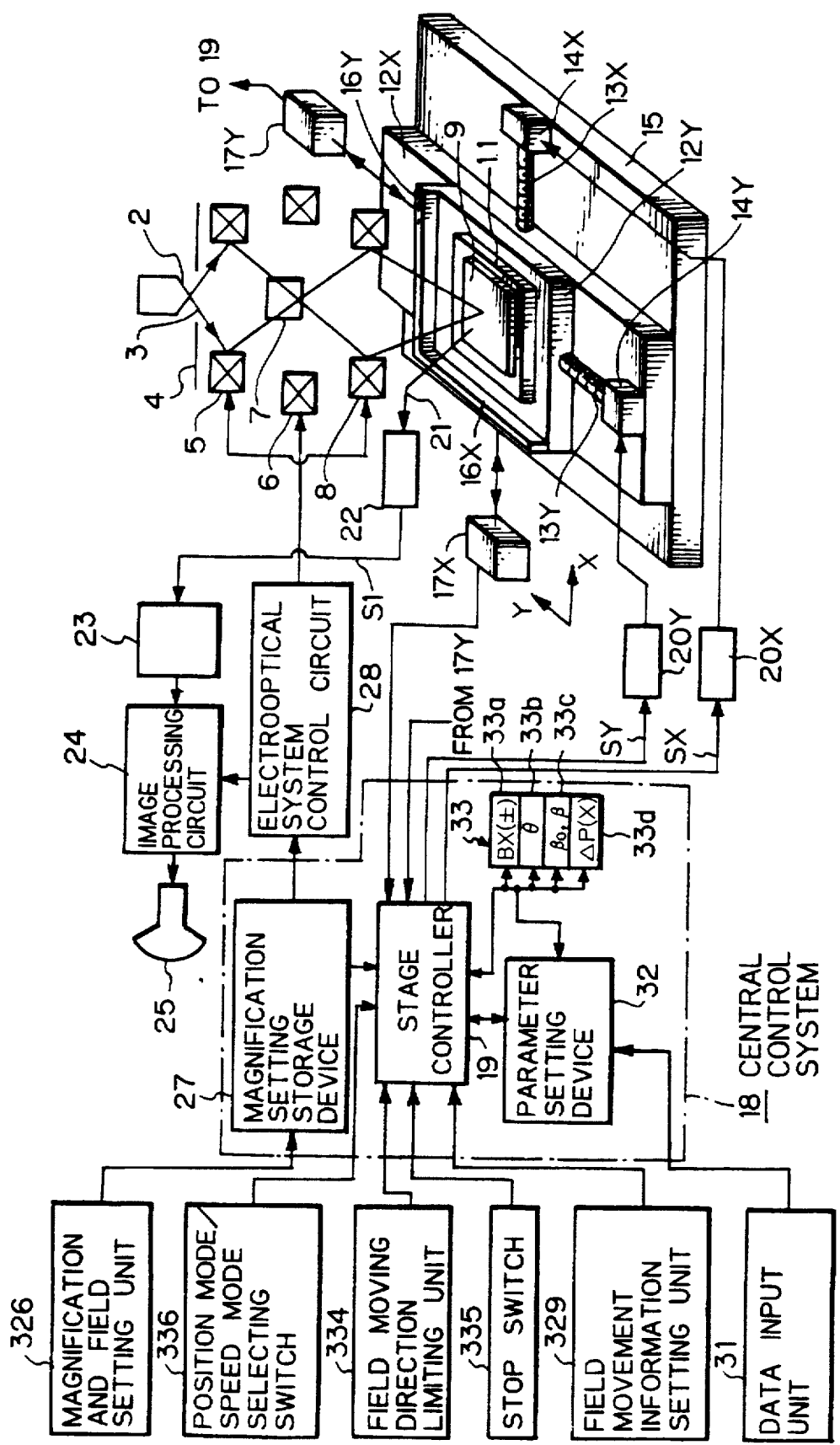
FIG. 21 is a block diagram partly containing a perspective view, showing one embodiment of the scanning electron microscope according to the present invention.

It should be noted that among the constituent elements shown in FIG. 21, those which have not been described above are similar to the corresponding constituent elements in FIG. 1. Therefore, description thereof is omitted.

Next, one example of an operation performed in this embodiment when the observation field set on the sample 9 is to be moved will be explained with reference to FIGS. 21 to 26. First, the sample 9 is placed on the sample holder 11 in FIG. 21, and an observation image of the sample 9 is displayed on the CRT display 25.

Figures 23A, 23B:
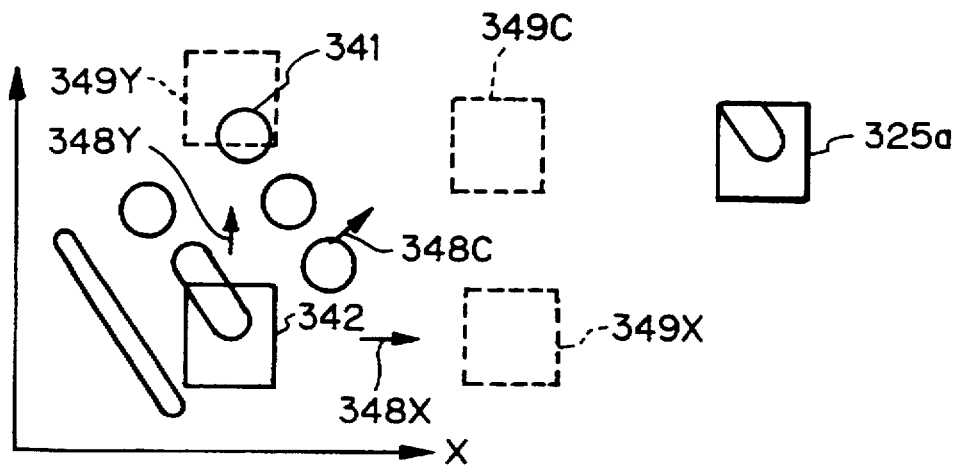
FIGS. 23(a) and 23(b) show an observation field on a sample, and an observation image thereof.

FIG. 23(a) shows an observation field 342 set on the sample 9 at that time. As shown in FIG. 23(a), a rectangular observation field 342 is set over patterns 341 on the sample 9. FIG. 23(b) shows a display screen 325a of the CRT display 25, which is shown in FIG. 21. A magnified image of a pattern in the observation field 342 is displayed on the display screen 325a. Accordingly, assuming that the magnification is β, the actual size of the observation field 342, shown in FIG. 23(a), is 1/β of the size of the display screen 325a, shown in FIG. 23(b).

Let us assume that under these conditions, the indicating elements 369X and 369Y, shown in FIG. 22, are off, and the moving direction of the observation field has been set to an arbitrary direction. First, when it is desired, to move the observation field 342 on the sample 9 to the vicinity of a near position 349C which is obliquely upward of the present position, the operator sets the position mode with the position mode/speed mode selecting switch 336, shown in FIG. 22, placed in a released state. Thereafter, the operator rotates the rotating member 363 of the track ball 362, shown in FIG. 22, in a right obliquely upward direction indicated by the arrow 370C. Consequently, the observation field 342 moves to a right obliquely upward position corresponding to the rotational angle. If the position is not coincident with the position 349C shown in FIG. 23(a), the operator should further rotate the rotating member 363 through an angle corresponding to the amount of positional displacement.

When it is desired to move the observation field 342 rapidly to a position 349X which is away from the present position precisely in the direction +X in FIG. 23(a), the operator first turns on only the indicating element 369X by actuating the switch 367 of the field moving direction limiting unit 334, shown in FIG. 22, thereby limiting the moving direction of the observation field to the direction X. Thereafter, even if the operator rotates the rotating member 363 in a direction slightly deviating from the rightward direction, as shown by the arrow 370X', the stage controller 19 regards only the count value TX as effective. Therefore, the observation field 342 accurately moves to a position away from the present position by a distance approximately corresponding to the rotational angle in the direction +X. Similarly, when it is desired to move the observation field 342 to a position 349Y which is away from the present position precisely in the direction +Y, the operator turns on only the indicating element 369Y by actuating the switch 367, shown in FIG. 22, thereby limiting the moving direction to the direction Y. Thereafter, the operator rotates the rotating member 363 of the track ball 362 approximately upwardly.

Next, when the observation field 342 is to be moved to a position which is far away from the present position in a right obliquely upward direction indicated by the arrow 348C in FIG. 23(a), the operator pushes the position mode/speed mode selecting switch 336, shown in FIG. 22, with his/her left hand to set the speed mode. Thereafter, while pushing the switch 336, the operator cancels the limitation on the moving direction through the field moving direction limiting unit 334. When the position and speed modes are changed over from one to the other, the stage controller 19 supplies a pulse to the clear terminal of each of the reversible counters 366X and 366Y, thereby resetting both the count values TX and TY to 0.

Thereafter, the operator rotates the rotating member 363 of the track ball 362, shown in FIG. 22, in a right obliquely upward direction indicated by the arrow 370C with his/her right hand. Consequently, the observation field 342 moves in the right obliquely upward direction at a speed corresponding to the rotational angle of the rotating member 363. When it is desired to change the speed of the movement of the observation field 342 (the absolute value of the moving speed) in that direction, the operator controls the rotational angle of the rotating member 363. When it is desired to stop the observation field 342 at a desired position, the operator removes his/her hand from the rotating member 363, and actuates the stop switch 335.

When it is desired to move the observation field 342 precisely in the direction +X as shown by the arrow 348X in FIG. 23(a), the operator first turns on only the indicating element 369X by actuating the switch 367 of the field moving direction limiting unit 334, shown in FIG. 22, thereby limiting the moving direction of the observation field to the direction X. Thereafter, even if the operator rotates the rotating member 363 in a direction slightly deviating from the rightward direction, as shown by the arrow 370X', the stage controller 19 regards only the count value TX as effective. Accordingly, the observation field 342 accurately moves in the direction +X at a speed approximately corresponding to the rotational angle of the rotating member 363. Similarly, when it is desired to move the observation field 342 precisely in the direction +Y as shown by the arrow 348Y, the operator turns on only the indicating element 369Y by actuating the switch 367, shown in FIG. 22, thereby limiting the moving direction to the direction Y. Thereafter, the operator rotates the rotating member 363 of the track ball 362 approximately upwardly.

Thus, according to this embodiment, the observation field 342 can be readily moved to a desired position simply by turning the rotating member 363 of the track ball 362 after selecting either the position or speed mode such that, when the observation field 342 is to be moved to a near position, the position mode is selected, whereas, when the observation field 342 is to be moved to a faraway position, the speed mode is selected.

Figures 24A, 24B:
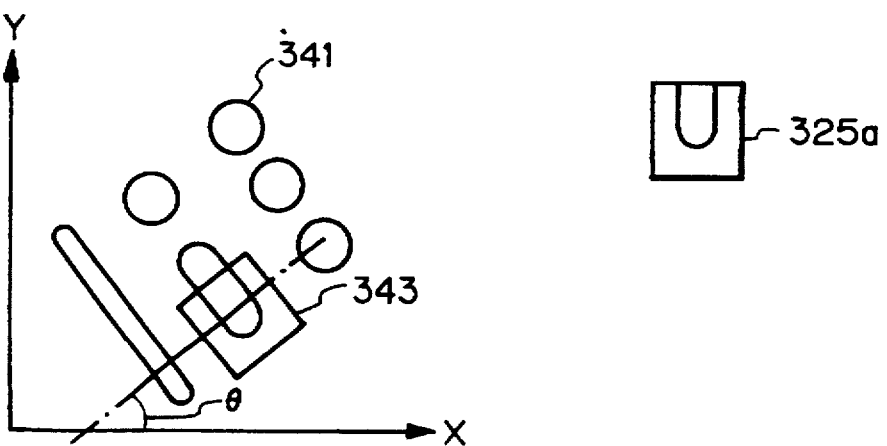
FIGS. 24(a) and 24(b) show a rotated observation field, and an observation image thereof.

Next, an operation performed when the observation field is to be electrically rotated will be explained. In this case, the operator rotates the observation field 342 on the sample through an angle θ (θ is herein assumed to be 45°) counterclockwise from the X-axis through the image magnification and field setting unit 326, shown in FIG. 21. As a result, the electron beam scanning direction on the sample 9 is rotated through 45° by the action of the magnification setting storage device 327, and as shown in FIG. 24(a), a rectangular observation field 343 is set over the patterns 341 on the sample 9 in parallel to a direction which is counterclockwise inclined at 45° with respect to the direction X. Further, the angle θ is stored into the rotational angle storage region 33b in the memory 33 through the stage controller 19, shown in FIG. 21. Thus, a magnified image of a pattern in the observation field 243 is displayed on the display screen 325a, as shown in FIG. 24(b). The magnified image is displayed in such a manner that each side of the rectangular observation field 343 is parallel or perpendicular to the sides of the display screen 325a.

Next, when it is desired to observe a region which lies precisely rightward of the right-hand side of the magnified image displayed on the display screen 325a in FIG. 24(b), the operator pushes the position mode/speed mode selecting switch 336 to set the speed mode, and in this state, limits the moving direction with the field moving direction limiting unit 334, shown in FIG. 22. Thereafter, he operator rotates the rotating member 363 of the track all 362 approximately rightwardly. Consequently, the stage controller 19 regards only the count value TX corresponding to the moving speed in the direction X as effective. The stage controller 19 reads out the angle θ from the rotational angle storage region 33b in the memory 33, and causes the stages 12X and 12Y to move in a direction rotated clockwise through the angle (180°−θ) with respect to the direction +X at a speed corresponding to the count value TX. This movement of the stages 12X and 12Y can be realized, for example, by moving the Y-stage 12Y by ΔX·tan θ in the direction −Y while moving the X-stage 12X by ΔX in the direction −X.

Figure 25A:
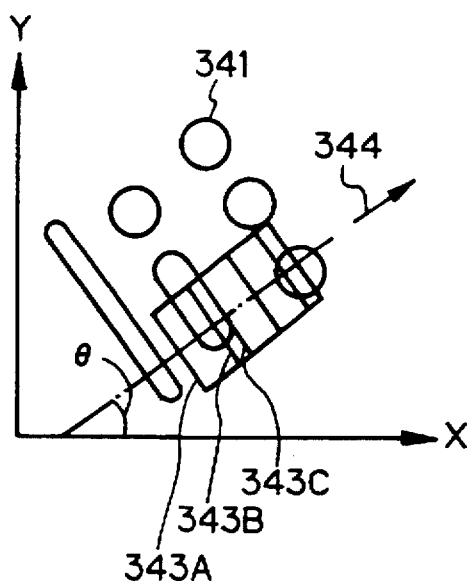
FIGS. 25(a), 25(b), 25(c) and 25(d) illustrate an operation performed when a rotated observation field is horizontally moved.
Figures 25B, 25C:
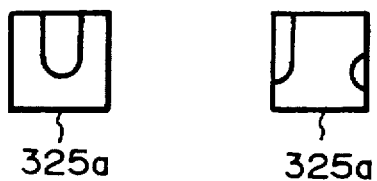
Figure 25D:
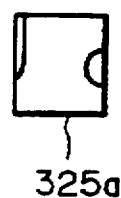

Consequently, as shown in FIG. 25(a), the observation field moves over the patterns 341 on the sample 9 from a region 343A through a region 343B to a region 343C . . . along a direction 344 which is counterclockwise tilted precisely at an angle θ with respect to the direction +X. As the observation field successively moves through the regions 343A, 343B and 343C, magnified images such as those shown in FIGS. 25(b), 25(c) and 25(d) are successively displayed on the display screen 325a of the CRT display 25. Accordingly, this embodiment enables the observation field to be moved in a set direction on the basis of the magnified image displayed on the display screen 325a by the mechanical field moving method independently of the amount of rotation of the observation field even when it is electrically rotated.

Figure 26:
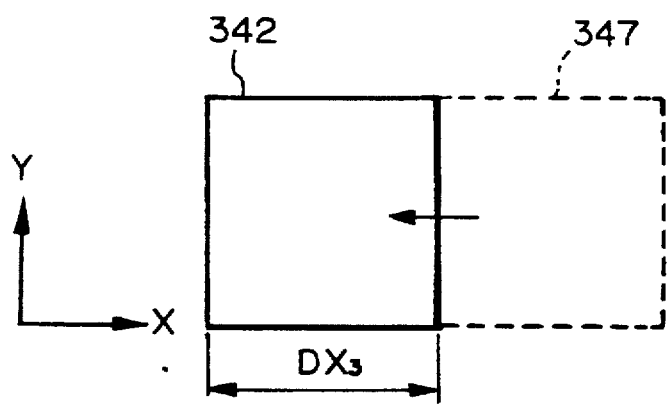
FIG. 26 illustrates the way in which an observation field is moved at a constant speed on a display screen.

The following is a description of one example of an operation performed in this embodiment when the observation field is to be moved in the speed mode after the observation magnification has been changed. At this time, the operator determines a speed at which the sample observation image is to be moved within the effective field range in the display screen of the CRT display 25, for example, through the data input unit 31, shown in FIG. 21. For example, a moving speed is set so that the sample observation image will move across the effective field range in a time period T (T is 3 seconds, for example, in this embodiment). Assuming that the observation field on the sample 9 is an observation field 342 having a width $DX_3$ in the direction X, as shown in FIG. 26, and that the observation field 342 is to be moved toward a region 347 which is adjacent to the present position in the direction +X in a time period T, the moving speed of the X-stage 12X is set at a speed $DX_3/T$ in the direction −X. The observation magnification at this time is assumed to be $\beta_0$ ($\beta_0$ is 10,000, for example). The observation magnification $\beta_0$ has been stored in a magnification storage region 33c, which is provided in the memory 33.

The rotational angle of the rotating member 363 of the track ball 362 (shown in FIG. 22) which is required to obtain the stage moving speed $DX_3/T$ has previously been set to a predetermined angle (hereinafter referred to as "reference rotational angle") through which the rotating member 363 can be readily rotated in a single operation by the operator. Accordingly, if the operator rotates the rotating member 363 rightwardly through an angle approximately equal to the reference rotational angle, the observation field 342 moves at such a speed that it crosses the effective field range of the display screen 325a approximately in the time period T.

Next, if the operator changes the observation magnification to β (β is 20,000, for example) through the magnification and field setting unit 26, the observation magnification β after the magnification change is stored into the magnification storage region 33c in the memory 33. The magnification storage region 33c has also been stored with the previous observation magnification $\beta_0$. Thereafter, if the operator rotates the rotating member 363 of the track ball 362, shown in FIG. 22, rightwardly through an angle approximately equal to the reference rotational angle after limiting the moving direction to the direction X, the stage controller 19 drives the X-stage 12X so that the moving speed of the image displayed on the display screen 325a of the CRT display 25 is equal to the image moving speed at the previous observation magnification.

More specifically, assuming that the observation field 342 is to be moved in the direction +X in FIG. 26, the stage controller 19 drives the X-stage 12X in the direction −X at a speed V(β) which is determined by the above-described Eq. (2).

Consequently, the sample observation image moves across the effective field range on the display screen of the CRT display 25 approximately in the time period T. ccordingly, in this embodiment, when the rotational angle f the rotating member 363 of the track ball 362 is the ame, the magnified image of the sample moves at a constant speed on the display screen independently of the observation magnification, and thus the controllability improves. Similarly, the moving speed of the observation field when it is to be moved in the position mode is also controlled in accordance with the observation magnification β.

Although in the above-described embodiment the track ball 362 is used as the field moving speed setting unit 329, an input device such as a joy stick may also be used in place of the track ball 362. In this embodiment, even when the observation field is to be moved to a faraway position, the required amount of displacement of the encoder can be minimized by using the speed mode. Therefore, it is possible to use even an input device in which the displacement range of the control shaft is limited as in the case of a joy stick.

According to the seventh scanning electron microscope, when the position control mode has been set, displacement information set through the displacement information setting device is regarded as information concerning the moving direction and moving distance, whereas, when the speed control mode has been set, the displacement information is regarded as information concerning the moving speed (including the moving direction). Accordingly, when the observation field is to be moved to a near position, the position control mode is selected, whereas, when the observation field is to be moved to a distant position, the speed control mode is selected, thereby enabling the observation field to be readily set to a desired position simply by setting minimal displacement information through the displacement information setting device.

When the displacement information setting device is a track ball, particularly, the observation field can be readily set to a desired position without increasing the required amount of rotation of the rotating member.

The present invention is not necessarily limited to the above-described embodiments, but may adopt various arrangements without departing from the gist of the present invention.

What is claimed is:

1. A scanning electron microscope in which a surface of a sample is scanned with an electron beam, and an image in a predetermined observation field on said sample is displayed on an image display device by using an image signal obtained by detecting secondary electrons emitted from said sample, said scanning electron microscope comprising:

a feed screw-driven stage for two-dimensionally moving said sample on a plane which is scanned with said electron beam;

two pulse motors for rotationally driving two feed screws, respectively, of said stage;

a micro-step drive controller for driving said two pulse motors by a micro-step drive control method;

a backlash memory for storing an amount of backlash observed when a moving direction of said stage is reversed; and a field movement control unit which, when said observation field is to be moved by a predetermined amount on said sample, corrects said predetermined amount of movement on the basis of (1) a moving direction of said stage immediately prior to the present time; (2) a stage moving direction to be taken subsequently; and (3) storage contents of said backlash memory, and which drives said pulse motors through an angle corresponding to the corrected amount of movement through said micro-step drive controller.

2. A microscope wherein a sample placed on a stage is observed through an objective lens, said microscope comprising:

a feed screw by which said stage is fed, said feed screw being provided with said stage;

a motor which drives said feed screw;

a controller which controls an amount of driving of said motor and by which said stage is moved with said feed screw;

a measuring device which measures an amount of backlash of said feed screw when a moving direction of said stage is reversed; and a correcting device which corrects an amount of movement of said stage on the basis of said amount of backlash measured by said measuring device when a moving direction of said stage is reversed.

3. A microscope according to claim 2, said measuring device comprising:

a movement controller which moves said stage from a first position to a second position in a predetermined direction and then moves said stage from the second position to a third position in said predetermined direction by driving said feed screw by a predetermined amount of driving and then turns said stage back in a reverse direction with respect to said predetermined direction so that said stage is moved from said third position to a fourth position by driving said feed screw by the same amount of driving as said predetermined amount of driving;

a detector which detects a position of an index pattern of said stage when said stage arrives at said second position by the movement of said stage in said predetermined direction and detects a position of said index pattern when said stage arrives at said fourth position by the movement of said stage in said reverse direction; and a computing unit which calculates said amount of backlash from an amount of deviation between said position of the index pattern detected at said second position and said position of the index pattern detected at said fourth position.

4. A microscope according to claim 3, wherein an amount of movement of said stage from said first position to said second position in the predetermined direction, an amount of movement of said stage from said second position to said third position in the predetermined direction and an amount of movement of said stage from said third position to said fourth position in the reverse direction are equal in magnitude.

5. A microscope wherein a sample placed on a stage is observed through an objective lens, said microscope comprising:

a feed screw by which said stage is fed, said feed screw being provided with said stage;

a motor which drives said feed screw;

a controller which controls an amount of driving of said motor and by which said stage is moved with said feed screw;

a memory which memorizes an amount of backlash of said feed screw when a moving direction of said stage is reversed; and a correcting device which corrects an amount of movement of said stage on the basis of said amount of backlash memorized in said memory when a moving direction of said stage is reversed.

6. A microscope according to claim 5, said microscope further comprising:

a movement controller which moves said stage from a first position to a second position in a predetermined direction and then moves said stage from the second position to a third position in said predetermined direction by driving said feed screw by a predetermined amount of driving and then turns said stage back in a reverse direction with respect to said predetermined direction so that said stage is moved from said third position to a fourth position by driving said feed screw by the same amount of driving as said predetermined amount of driving;

a detector which detects a position of an index pattern of said stage when said stage arrives at said second position by the movement of said stage in said predetermined direction and detects a position of said index pattern when said stage arrives at said fourth position by the movement of said stage in said reverse direction; and a computing unit which calculates said amount of backlash from an amount of deviation between said position of the index pattern detected at said second position and said position of the index pattern detected at said fourth position;

said memory memorizing said amount of backlash calculated by said computing unit.

7. A microscope according to claim 5, wherein said microscope is a scanning electron microscope in which a surface of said sample is scanned with an electron beam, and an image in a predetermined observation field on said sample is displayed on an image display device by using an image signal obtained by detecting secondary electrons emitted from said sample.

* * * * *